(12) United States Patent
Kato et al.

(10) Patent No.: US 9,172,043 B2
(45) Date of Patent: Oct. 27, 2015

(54) CHARGE-TRANSPORTING VARNISH FOR SPRAY OR INK JET APPLICATION

(75) Inventors: Taku Kato, Funabashi (JP); Takuji Yoshimoto, Funabashi (JP); Go Ono, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 1295 days.

(21) Appl. No.: 12/091,725

(22) PCT Filed: Oct. 25, 2006

(86) PCT No.: PCT/JP2006/321218
§ 371 (c)(1),
(2), (4) Date: Apr. 25, 2008

(87) PCT Pub. No.: WO2007/049631
PCT Pub. Date: May 3, 2007

(65) Prior Publication Data
US 2009/0239045 A1    Sep. 24, 2009

(30) Foreign Application Priority Data

Oct. 28, 2005 (JP) ................................. 2005-313599
Mar. 30, 2006 (JP) ................................. 2006-093058

(51) Int. Cl.
| | | |
|---|---|---|
| B32B 3/10 | (2006.01) | |
| C09D 11/02 | (2014.01) | |
| B05D 1/02 | (2006.01) | |
| B05D 5/06 | (2006.01) | |
| H01L 51/00 | (2006.01) | |
| C09D 5/24 | (2006.01) | |
| C09D 11/36 | (2014.01) | |
| C09D 179/02 | (2006.01) | |
| H01B 1/12 | (2006.01) | |
| H01L 51/50 | (2006.01) | |

(52) U.S. Cl.
CPC .............. *H01L 51/0003* (2013.01); *C09D 5/24* (2013.01); *C09D 11/36* (2013.01); *C09D 179/02* (2013.01); *H01B 1/128* (2013.01); *H01L 51/0005* (2013.01); *H01L 51/0007* (2013.01); *H01L 51/0035* (2013.01); *H01L 51/0043* (2013.01); *H01L 51/5052* (2013.01); *Y10T 428/24802* (2015.01)

(58) Field of Classification Search
USPC ........................................................ 429/690
See application file for complete search history.

(56) References Cited

U.S. PATENT DOCUMENTS

| | | |
|---|---|---|
| 5,728,321 A | 3/1998 | Abe et al. |
| 7,026,080 B2 | 4/2006 | Nakayama et al. |
| 2003/0042472 A1 | 3/2003 | Fujita et al. |
| 2003/0194631 A1 * | 10/2003 | Suwa et al. .................... 430/151 |
| 2004/0079940 A1 * | 4/2004 | Redecker et al. ................ 257/40 |
| 2004/0144975 A1 | 7/2004 | Seki et al. |
| 2004/0152832 A1 * | 8/2004 | Kirchmeyer et al. ......... 524/800 |
| 2005/0082514 A1 | 4/2005 | Yoshimoto et al. |
| 2005/0156148 A1 | 7/2005 | Kanbe et al. |
| 2006/0033080 A1 | 2/2006 | Harada et al. |
| 2006/0115652 A1 | 6/2006 | Yoshimoto et al. |
| 2006/0225611 A1 * | 10/2006 | Kato et al. ..................... 106/236 |
| 2007/0079869 A1 | 4/2007 | Yukinobu |
| 2007/0173578 A1 | 7/2007 | Spreitzer et al. |
| 2007/0187672 A1 | 8/2007 | Ono et al. |

FOREIGN PATENT DOCUMENTS

| | | |
|---|---|---|
| DE | 10 2004 007 777 A1 | 9/2005 |
| EP | 1 589 788 A1 | 10/2005 |
| EP | 1 640 372 A1 | 3/2006 |
| JP | 3-28229 A | 2/1991 |
| JP | 2000-204158 A | 7/2000 |
| JP | 2001-52861 A | 2/2001 |
| JP | 2002-151272 A | 5/2002 |
| JP | 2004-95406 A | 3/2004 |
| JP | 2004-127897 A | 4/2004 |
| JP | 2005-108828 A | 4/2005 |
| JP | 2005-141934 A | 6/2005 |
| JP | 2006-66111 A | 3/2006 |
| WO | WO 00/59267 A1 | 10/2000 |
| WO | WO-03/029899 A1 | 4/2003 |
| WO | WO-03/071559 A1 | 8/2003 |
| WO | WO-2004-043117 A1 | 5/2004 |
| WO | WO 2004/105446 A1 * | 12/2004 ............ H05B 33/22 |
| WO | WO 2004/105446 A1 | 12/2004 |
| WO | WO-2005/000832 A1 | 1/2005 |
| WO | WO 2005/041217 A1 | 5/2005 |
| WO | WO 2005/092984 A1 | 10/2005 |

OTHER PUBLICATIONS

European Search Report dated Jan. 23, 2012 for Application No. 06 82 2195.

* cited by examiner

*Primary Examiner* — J. L. Yang
(74) *Attorney, Agent, or Firm* — Birch, Stewart, Kolasch & Birch, LLP

(57) ABSTRACT

Disclosed is a charge-transporting varnish containing a charge-transporting organic material, a good solvent, at least one poor solvent with high leveling properties, and at least one volatile poor solvent. The charge-transporting organic material is composed of a charge-transporting material consisting of a charge-transporting monomer or a charge-transporting oligomer having a number average molecular weight of 200 to 5000, or alternatively composed of such a charge-transporting material and an electron-accepting dopant material or a hole-accepting dopant material. This charge-transporting varnish enables to form a uniform and smooth charge-transporting thin film by a spray method or an ink jet method on an exposed electrode portion such as ITO or IZO of a substrate on which a structure of a simple or complicated pattern is formed beforehand.

16 Claims, 2 Drawing Sheets

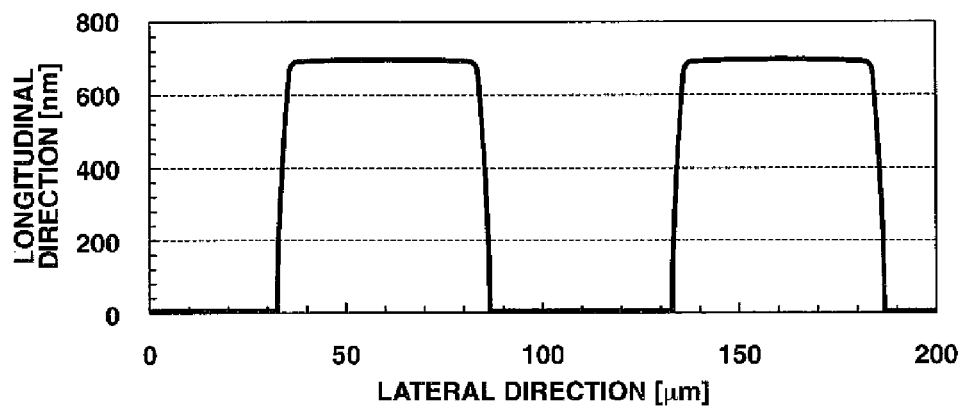
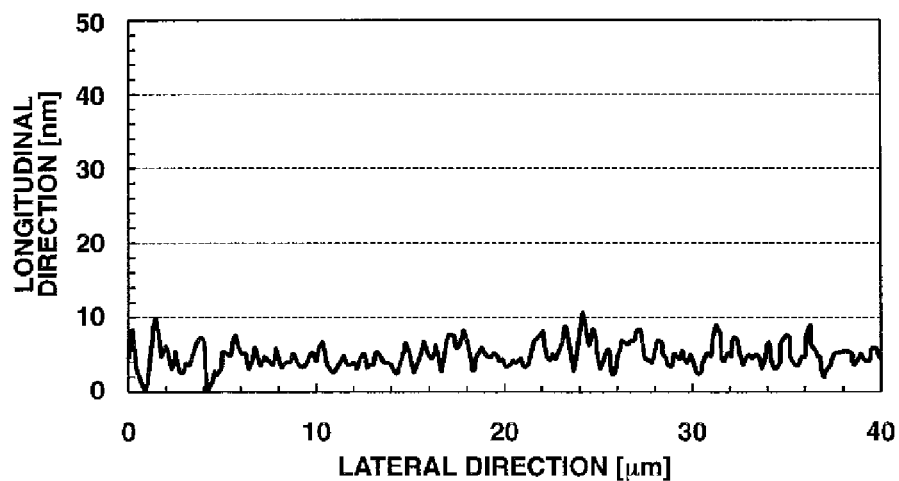
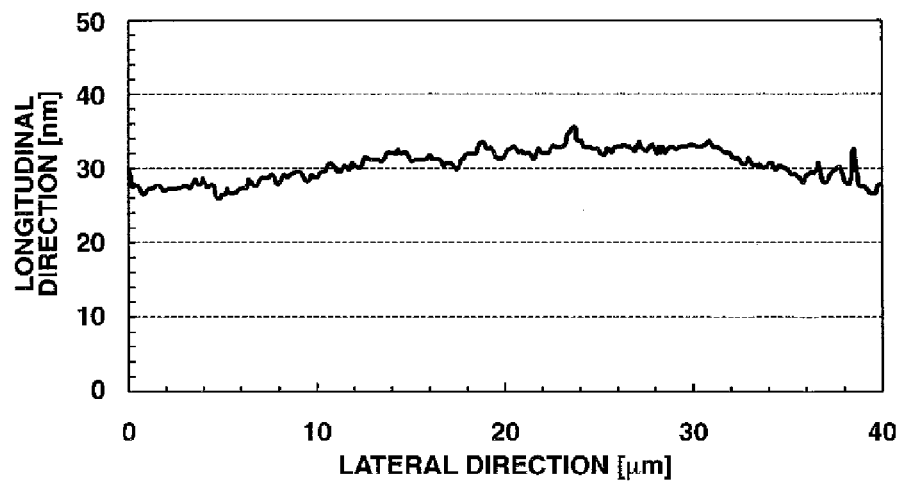

CHARGE-TRANSPORTING VARNISH FOR SPRAY OR INK JET APPLICATION

TECHNICAL FIELD

This invention relates to a charge-transporting vanish for spray or ink jet application.

BACKGROUND ART

Where organic compounds, particularly polymers and oligomers, are used as an electronic device material, they are frequently employed as a thin film. For instance, mention is made of an insulating film, charge transporting film, protective film and flattened film.

In organic electroluminescent (hereinafter abbreviated as EL) devices, charge transporting thin films made of polymers or oligomers are used as a hole transport layer (buffer layer) and a charge injection layer (see, for example, Patent Document 1).

It is required that the charge transporting thin film can be formed on a flat electrode such as of indium tin oxide (hereinafter abbreviated as ITO), indium zinc oxide (hereinafter abbreviated as IZO) or the like in the form of a uniform, unevenness-free thin film. However, when a charge transporting thin film is formed actually in an electronic device, a structure is formed on the electrode in most cases. More particularly, a structure of at least one simple or complicated pattern having a thickness of several μm may be formed in some case. A charge transporting varnish of a type, which is used to selectively, flatly form a charge transporting thin film on an exposed ITO or IZO electrode portion of a substrate on which a structure constituted of a simple or complicated pattern has been formed, may frequently differ in liquid physical properties from a charge transporting varnish of the type used to form a charge transporting thin film uniformly on a flat electrode. Thus, the liquid physical properties of a charge transporting varnish adapted for the structure on a substrate need to be studied in detail.

Among electronic devices, on the other hand, an organic EL device has recently drawn attention as a next-generation thin display that is being put to practice, and is one of electronic devices, which is now under study for practical use. As it becomes more likely for the device to come into practical use, it has been required in the production line to make a highly reliable device inexpensively and in good yield and high efficiency. Especially, the inexpensiveness is a self-evident requirement, with a tendency to meet the requirement through a trial and error approach to processes of making a charge transporting thin film.

The process of making a charge transporting thin film can be broadly classified into a dry process, typical of which is a vacuum deposition process, and a wet process typified by a spin coating process. According to the comparison between the dry process and the wet process, the charge transporting thin film formed by the wet process rather than the dry process is higher in the ability of covering an electrode such as of ITO or IZO and is able to uniformly coat foreign matters on the electrode surface in even thickness, thereby drastically improving electric short-circuiting characteristics of an electronic device being fabricated. In this regard, the wet process is more advantageous and higher in superiority.

Hence, we made continued studies on the fabrication of a charge transporting thin film responsible for electronic devices, to which a wet process is applicable (see, for example, Patent Document 2).

The wet process needs a very large amount of a charge transporting varnish necessary for forming a charge transporting thin film, for example, by a spin coating process or printing process. More particularly, aside from a charge transporting varnish contributing to the formation of a charge transporting thin film, a ratio of a charge transporting varnish to be wasted becomes very large, resulting in poor cost performance.

For a process of making a charge transporting thin film in high efficiency, a spray process or ink jet process can be mentioned. Particularly, the spray process is effective, from the standpoint of the general versatility of apparatus, as a wet process capable of making a large-area device.

Consequently, it becomes necessary to provide a charge transporting varnish that is optimum for forming, according to a spray process or an ink jet process, a uniform, unevenness-free charge transporting thin film on an exposed ITO or IZO electrode portion of a substrate forming a structure of a simple or complicated pattern thereon.

This problem of forming a charge transporting thin film on a substrate forming a structure of a simple or complicated pattern thereon is important not only for the thin film for electronic devices, but also for other technical fields using thin films.

For the reasons set out above, there is a demand for development of a charge transporting varnish suited for the spray or ink jet process.

Patent Document 1:
JP-A 2002-151272
Patent Document 2:
PCT Patent Publication No. WO 2004/043117

DISCLOSURE OF THE INVENTION

Problems to be Solved by the Invention

The invention has been made in light of these circumstance in the art and has for its object the provision of a charge transporting varnish for forming a uniform, unevenness-free charge transporting film on an exposed ITO or IZO electrode portion of a substrate forming a structure of a simple or complicated pattern thereon by a spray process or an ink jet process.

The invention also has for another object the provision of an organic EL device provided with a charge transporting thin film formed from the varnish in the sense of application as an electronic device.

Means for Solving the Problems

We made intensive studies in order to achieve the above objects and as a result, surprisingly found that a varnish containing a good solvent, at least one poor solvent with high leveling properties and at least one volatile poor solvent is able to form a charge transporting thin film selectively and flatly on an exposed ITO or IZO electrode portion of a substrate forming a structure in a simple or complicated pattern thereon, thereby arriving at completion of the invention.

More particularly, the present invention provides the following inventions [1] to [21].

[1] A varnish for spray or ink jet application, including a base material made of an organic compound having a molecular weight of 200 to 1000 or an oligomer having a molecular weight of 200 to 5000, a good solvent, at least one poor solvent with high leveling properties, and at least one volatile poor solvent.

[2] A charge transporting varnish for spray or ink jet application, including a charge transporting material made of a charge transporting monomer or a charge transporting oligomer having a number average molecular weight of 200 to 5000, or said transporting organic material and an electron accepting dopant material or a hole accepting dopant material, a good solvent, at least one poor solvent with high leveling properties, and at least one volatile poor solvent.

[3] The charge transporting varnish for spray or ink jet application of [2], wherein the good solvent is at least one selected from N,N-dimethylformamide, N,N-dimethylacetamide, N-methylpyrrolidone and 1,3-dimethyl-2-imidazolidinone.

[4] The charge transporting varnish for spray or ink jet application of [2] or [3], wherein said poor solvent with high leveling properties is at least one selected from cyclohexanol, 2,3-butanediol and propylene glycol.

[5] The charge transporting varnish for spray or ink jet application of any one of [2] to [4], wherein the volatile poor solvent is at least one selected from ethanol, isopropanol, isobutanol and ethylene glycol monobutyl ether.

[6] The charge transporting varnish for spray or ink jet application of [2], wherein a combination of the good solvent, the at least one poor solvent with high leveling properties and the at least one volatile poor solvent is 1,3-dimethyl-2-imidazolidinone, cyclohexanol and isobutanol, 1,3-dimethyl-2-imidazolidinone, cyclohexanol and ethylene glycol monobutyl ether, 1,3-dimethyl-2-imidazolidinone, cyclohexanol and ethanol, N-methylpyrrolidone, cyclohexanol and isobutanol, N-methylpyrrolidone, cyclohexanol and ethanol, N,N-dimethylacetamide, cyclohexanol and isobutanol, N,N-dimethylacetamide, cyclohexanol and ethanol, 1,3-dimethyl-2-imidazolidinone, 2,3-buanediol and isobutanol, 1,3-dimethyl-2-imidazolidinone, 2,3-buanediol and ethanol, N-methylpyrrolidone, 2,3-butanediol and isobutanol, N-methylpyrrolidone, 2,3-butanediol and ethanol, N,N-dimethylacetamide, 2,3-butanediol and isobutanol, N,N-dimethylacetamide, 2,3-butanediol and ethanol, 1,3-dimethyl-2-imidazolidinone, dipropylene glycol and isobutanol, 1,3-dimethyl-2-imidazolidinone, dipropylene glycol and ethanol, N-methylpyrrolidone, dipropylene glycol and isobutanol, N-methylpyrrolidone, dipropylene glycol and ethanol, N,N-dimethylacetamide, dipropylene glycol and isobutanol, or N,N-dimethylacetamide, dipropylene glycol and ethanol.

[7] The charge transporting varnish for spray or ink jet application of any one of [2] to [6], wherein the charge transporting material is a charge transporting monomer having a conjugated unit, or a charge transporting oligomer having conjugated units and a number average molecular weight of 200 to 5000 wherein single conjugated units are sequentially bonded or two or more different types of conjugated units are sequentially combined in an arbitrary order.

[8] The charge transporting varnish for spray or ink jet application of [7], wherein the conjugated unit is at least one selected from substituted or unsubstituted and divalent to tetravalent, aniline, thiophene, dithiine, furan, pyrrole, ethynylene, vinylene, phenylene, naphthalene, anthracene, imidazole, oxazole, oxadiazole, quinoline, quinoquizaline, silole, silicon, pyridine, pyrimidine, pyrazine, phenylenevinylene, fluorene, carbazole, triarylamine, metal or metal-free phthalocyanine or metal or metal-free porphyrin.

[9] The charge transporting varnish for spray or ink jet application of [7], wherein the charge transporting material is an oligoaniline derivative represented by the general formula (1) or a quinonediimine derivative which is oxidized product of the general formula (1).

[Chemical Formula 1]

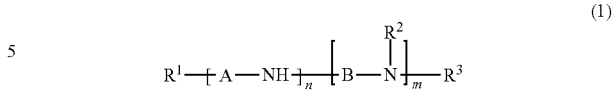

(1)

[wherein $R^1$, $R^2$ and $R^3$ independently represent hydrogen, a hydroxyl group, a halogen group, an amino group, a silanol group, a thiol group, a carboxyl group, a phosphate group, a phosphoester group, an ester group, a thioester group, an amido group, a nitro group, a monovalent hydrocarbon group, an organoxy group, an organoamino group, an organosilyl group, an organothio group, an acyl group, or a sulfone group, and A and B independently represent a divalent group of the general formula (2) or (3)

[Chemical Formula 2]

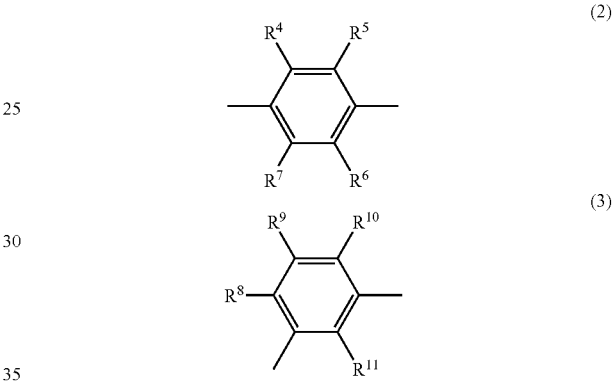

(wherein $R^4$ to $R^{11}$ independently represent hydrogen, a hydroxyl group, a halogen group, an amino group, a silanol group, a thiol group, a carboxyl group, a phosphate group, a phosphoester group, an ester group, a thioester group, an amido group, a nitro group, a monovalent hydrocarbon group, an organoxy group, an organoamino group, an organosilyl group, an organothio group, an acyl group, or a sulfone group, and m and n are independently an integer of 1 or over provided that $m+n \leq 20$ is satisfied).]

[10] The charge transporting varnish for spray or ink jet application of [9], wherein the charge transporting material is an oligoaniline derivative represented by the general formula (4) or an quinonediimine derivative which is an oxidized product of the general formula (4)

[Chemical Formula 3]

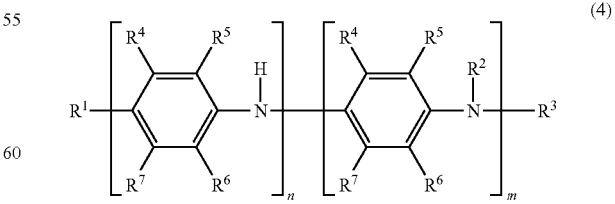

(4)

(wherein $R^1$ to $R^7$, m and n, respectively, have the same meanings as defined above).

[11] The charge transporting varnish for spray or ink jet application of any one of [2] to [10], wherein the electron accepting dopant material is sulfonic acid derivative represented by the general formula (5)

[Chemical Formula 4]

$$R^{13}\underset{R^{12}}{\overset{}{D}}SO_3H \qquad (5)$$

(wherein D represents a benzene ring, a naphthalene ring, an anthracene ring, a phenanthrene ring or a heterocyclic ring, and $R^{12}$ and $R^{13}$ independently represent a carboxyl group or a hydroxyl group).

[12] The charge transporting varnish for spray or ink jet application of any one of [2] to [10], wherein the electron accepting dopant material is a sulfonic acid derivative represented by the general formula (6)

[Chemical Formula 5]

$$\left( \underset{(SO_3H)_x}{\overset{R^{15}\ R^{16}\ R^{17}}{\underset{O\ \ O\ R^{18}}{R^{14}\diagdown C-X}}} \right)_y \hspace{-5mm} A \qquad (6)$$

(wherein $R^{14}$ to $R^{18}$ independently represent a hydrogen atom, an unsubstituted or substituted monovalent hydrocarbon group or a halogen atom, X represents a single bond, O, S or NH, A represents a hydrogen atom, a halogen atom, O, S, an S(O) group, an S(O$_2$) group, or N, Si, P or a P(O) group to which an unsubstituted or substituted group is bonded, or a monovalent or higher valent unsubstituted or substituted hydrocarbon group, y is equal to the valence of A and is such an integer as to satisfy 1≤y, and x represents the number of sulfone groups bonded to a benzene ring moiety of 1,4-benzodioxane skeleton and is 1≤x≤4).

[13] The charge transporting varnish for spray or ink jet application of any one of [2] to [10], wherein the electron accepting dopant material is an arylsulfonic acid derivative represented by the general formula (7)

[Chemical Formula 6]

$$\left( \underset{(SO_3H)_n}{\overset{A-X}{|}} B \right)_q \qquad (7)$$

[wherein X represents O, S or NH, A represents a naphthalene ring or an anthracene ring which may have a substituent other than X and n of (SO$_3$H) groups, B represents an unsubstituted or substituted hydrocarbon group, a 1,3,5-triazine group or an unsubstituted or substituted group represented by the following formula (8) or (9)

[Chemical Formula 7]

(8)

(9)

(wherein $W^1$ and $W^2$ independently represent O, S, an S(O) group, an S(O$_2$) group, or N, Si, P or a P(O) group to which an unsubstituted or substituted group is bonded), n is the number of sulfone groups bonded to A and is an integer of 1≤n≤4, and q is the number of bonds between B and X and is an integer satisfying 1≤q).]

[14] A thin film, characterized by being formed by use of a charge transporting varnish for spray or ink jet application of [1].

[15] A charge transporting thin film, characterized by being formed by use of a charge transporting varnish for spray or ink jet application as recited in any one of [2] to [13].

[16] The charge transporting thin film of [1,5], characterized by being formed by a spray method.

[17] An organic electroluminescent device including the charge transporting thin film of [1,5] or [16].

[18] The organic electroluminescent device of [1,7], wherein the charge transporting thin film is a hole injecting layer or hole transporting layer.

[19] A method for making a thin film, characterized by applying a varnish of [1] onto a substrate by a spray or ink jet method and evaporating a solvent.

[20] A method for making a charge transporting thin film, characterized by applying a charge transporting varnish of any one of [2] to [1,3] onto a substrate by a spray or an ink jet method and evaporating a solvent.

[21] The method for making a charge transporting thin film of [20], wherein the application is carried out by the spray method.

Effects of the Invention

Using the varnish of the invention, a charge transporting thin film can be reproducibly formed selectively, flatly on an exposed ITO or IZO electrode portion of a substrate on which a structure constituted of a simple or complicated pattern has been formed.

This has been verified by the present inventors by measuring a film thickness distribution between structures of a structure-attached substrate by means of a high-precision fine profile measuring instrument, SUREFCORDER ET4000A.

According to the measurement, it has been confirmed that the thin film obtained form the varnish of the invention is one that has a uniform film thickness distribution between the structures and is high in flatness and uniformity.

The varnish of the invention can be simply prepared by use of a water-free organic solvent. This varnish enables film formation according to many wet processes and especially, it is preferred to form a film by a spray process or an ink jet process. A thin film can be formed on a substrate inexpensively in high yield.

With respect to a coating process of a charge transporting varnish used in an organic EL device, an ink jet process or spray process is more actual than spin coating and printing processes as an industrial process from the standpoint of a device yield and production efficiency. The charge transporting varnish of the invention adapts for these industrial processes and is able to reproducibly provide a charge transporting thin film of high reliability.

Where the charge transporting varnish, which is able to selectively form a flat film on an exposed ITO or IZO electrode portion of a substrate on which a simple or complicated pattern structure has been formed, is applied to an organic EL device, an excellent effect of preventing electric short-circuiting is shown along with a uniform light emission effect being also shown within pixels due to the excellent thickness uniformity and film formability within pixel. This effect becomes pronounced, especially when the application is made on a substrate on which there has been formed a structure constituted of a simple or complicated pattern such as of a passive matrix or active matrix.

With the case of the application on a substrate on which a simple or complicated pattern structure has been formed, a spin coating process is liable to cause a thickness distribution within structures at a central portion and an edge portion of a substrate as the substrate size increases. Additionally, the thickness distribution may occur within one structure although depending on the baking conditions and leveling conditions. This is because the spin coating process is a wet process wherein a dropped varnish is formed as a film by the action of a stress acting outwardly of a rotating substrate and dried.

With a printing process used for application on a substrate on which a simple or complicated pattern structure has been formed, because an APR plate used mainly as a printing plate is in direct contact with the structure, there is the possibility that the structure formed of a fine pattern may be destroyed. Where a structure has been formed on a substrate beforehand, it is preferred not to destroy the structure by direct contact and thus, the printing process is not favorable.

Where an attempt has been made to form a film from the charge transporting varnish of the invention according to a spray process or ink jet process, no demerit resulting from a process such as the spin coating process or printing process is found and thus, a flat film can be selectively formed on an exposed ITO or IZO electrode portion of a substrate on which a simple or complicated pattern structure has been formed. For this, in the industrialization of organic EL devices, it becomes possible to manufacture stable organic EL devices in high yield and high efficiency.

Where the charge transporting thin film of the invention is applied as a hole injection layer or hole transport layer, this film is more excellent in flatness and uniformity than conventional charge transporting thin films and can significantly suppress the short-circuiting of electrodes caused by irregularities of the ITO electrode and foreign matters existing on the electrode.

Accordingly, the use of the charge transporting thin film of the invention leads to a lowering of an emission initiation voltage of an EL device, an improvement of current efficiency and a prolonged life of the device, and enables an inexpensive EL device of high production efficiency to be manufactured in high yield.

Further, the charge transporting thin film of the invention can be formed as a film by application on various types of substrates by a variety of coating processes and is thus useful for application as a capacitor electrode protective film, an antistatic film and an organic film used for a gas sensor, a temperature sensor, a humidity sensor, a pressure sensor, a light sensor, a radiation sensor, an ion sensor, a biosensor, or a field emission transistor sensor; an organic film used for a primary cell, a secondary cell, a fuel cell, a solar cell or a polymer cell; and an electromagnetic shield film, a ultraviolet light absorption film, a gas barrier film and an optical information recording medium or an organic film used for an optical integrated circuit.

BRIEF DESCRIPTION OF THE DRAWINGS

FIG. 1 is a chart showing the results of measurement of a profile of a substrate with a structure.

FIG. 2 is a chart showing the results of measurement of an ITO portion of a structure-attached substrate.

FIG. 3 is a chart showing the results of measurement of a thickness distribution of a charge transporting thin film of Example 1.

BEST MODE FOR CARRYING OUT THE INVENTION

Figure 4:
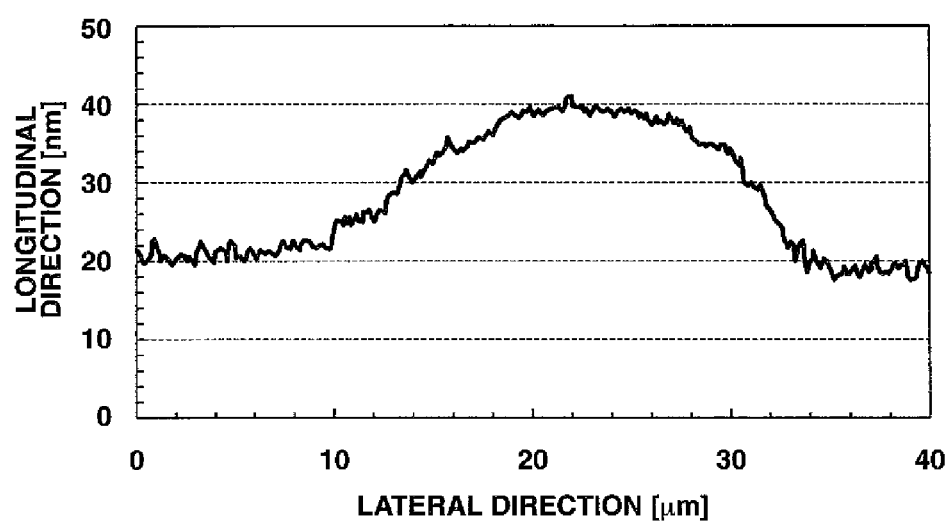
FIG. 4 is a chart showing the results of a thickness distribution of a charge transporting thin film of Comparative Example 1.

The invention is now described in more detail.

The varnish related to the invention includes a base material made of an organic compound having a molecular weight of 200 to 1000 or an oligomer having a molecular weight of 200 to 5000, a good solvent, at least one poor solvent with high leveling properties, and at least one volatile poor solvent.

The varnish of a type wherein the base material is made of a charge transporting material composed of a charge transporting monomer or a charge transporting oligomer having a number average molecular weight of 200 to 5000, or a charge transporting organic material composed of the above-mentioned charge transporting material and an electron accepting dopant material or a hole accepting dopant material is a charge transporting varnish.

The term, charge transporting, used herein has the same meaning as electric conducting and means any of hole transporting, electron transporting, and transporting of both charges of hole and electron. The charge transporting varnish of the invention may be one that has charge transportability in itself, or one wherein a solid film obtained from the varnish exhibits charge transportability.

Although an application process of the varnish of the invention is not critical, a process of applying the varnish in the form of mist is preferred. More particularly, a spray process, an ink jet process and the like are mentioned, of which a spray process is most suited.

In the course of a spray process before a charge transporting varnish is sprayed on a substrate and arrives at or attaches to the substrate, the charge transporting varnish should preferably take three optimum liquid physical properties. The three liquid physical properties in the spray process include 1) a liquid physical property of the varnish charged in a tank before spraying, 2) a liquid physical property of a mist being sprayed, and 3) a liquid physical property of the varnish after arriving at the substrate.

More particularly, it is preferred in 1) that a dynamic viscosity (hereinafter abbreviated as viscosity) is low so as to ensure good spray applicability. The term, spray applicability means a characteristic property of stably, constantly regulating a size of spray mist discharged from a spray head although depending on spray conditions. The lowering of the spray applicability is a tendency observed with a varnish that is unlikely to be atomized by the action of a given amount of nitrogen, and a varnish having a high viscosity does not provide a uniformly atomized spray mist having a narrow size distribution after atomization with nitrogen. On the other hand, a charge transporting varnish having a low viscosity is converted to a uniform spray mist having a narrow size distribution after atomization with a given amount of nitrogen. With respect to 3), the leveling properties of the varnish finely atomized after arrival at or attachment to a substrate should preferably be good. To this end, the varnish should have an appropriate viscosity. Especially, where a charge transporting thin film is formed on an exposed ITO or IZO electrode portion of a substrate formed with a simple or complicated pattern structure thereon, a low viscosity of the varnish may frequently bring about the liquid flow between structures, thus making it difficult to obtain a charge transporting thin film which has structure-to-structure uniformity and flatness. On the other hand, if the varnish is high in viscosity, the leveling properties of the varnish after attachment to substrate becomes worsened, with the tendency toward haze unevenness and skin unevenness without formation of a uniform film surface. Moreover, if the viscosity of the varnish is high, it has to take a long standing time required for leveling and thus, an advantage from the standpoint of tact time lowers.

In order to achieve the liquid physical properties of 1) and 3) by the same varnish, it is necessary to add a step of concentrating the varnish in the spray mist. Accordingly, the liquid physical property of 2) changes with a lapse of time and it is preferred that the step of the varnish concentration is substantially saturated and converges when the liquid physical property of 3) is attained, thereby providing a certain liquid property.

More particularly, at least one type of volatile poor solvent is contained for the liquid physical property of 1), a step of evaporating at least one type of volatile poor solvent is included for the liquid physical property of 2), at least one type of poor solvent with high leveling properties is contained for the liquid physical property of 3), and no volatile poor solvent is contained. These are a concept as to why a mixture of three types of organic solvents is adopted in the practice of the invention.

The good solvent is an organic solvent (solvent with high solubility) capable of dissolving the base material. Preferably, a good solvent suppresses a base material from being precipitated and a dissolving state can be held. In contrast, such a good solvent is not preferred wherein a good solvent in a spray mist is evaporated during the course of spray application to permit a base material to be precipitated. The precipitation of a base material causes a foreign matter, so that the effect of the invention that a uniform, flat organic thin film is formed cannot be satisfactorily developed. With an organic thin film wherein foreign matters deposit and uniformity and flatness are low, when built in an organic EL device, the film could be a factor of low efficiency, short lifetime, non-uniform plane emission, or electric short-circuiting characteristic.

Although the evaporation of a good solvent in spray mist in the course of spray application may frequently depend on spray application conditions such as, for example, those conditions of 1) increasing an amount of nitrogen, 2) reducing an amount of chemicals, 3) increasing a gap, 4) speeding up, and 5) broadening an XY scanning range, it is preferred to fundamentally select spray application conditions as not to allow a good solvent in the spray mist to be evaporated.

Specific examples of the good solvent include N,N-dimethylformamide (hereinafter abbreviated as DMF), N,N-dimethylacetamide (hereinafter abbreviated as DMAc), N-methylpyrrolidone (hereinafter abbreviated as NMP), 1,3-dimethyl-2-imidazolidinone (hereinafter abbreviated as DMI), dimethylsulfoxide, N-cyclohexyl-2-pyrrolidinone and the like although not limited thereto. Of these good solvents, NMP and DMI are referred, of which DMI is more preferred.

The content of the good solvent relative to the total solvent used in the varnish is not critical so far as a base material is dissolved in the good solvent and is generally within a range of 1 to 90 wt %.

The poor solvent with high leveling properties is an organic solvent that does not dissolve a base material, is arbitrarily miscible with a good solvent and a volatile poor solvent, and is left without evaporation from a spray mist during the spray application and attaches to a substrate, at which a leveling effect is shown. The leveling effect is an effect of determining uniformity of a thin film in wet condition prior to baking, and if the leveling effect is low, there cannot be obtained an organic thin film that is high in uniformity and flatness. More particularly, the poor solvent is one that has an effect of widening a difference (hysteresis) between an angle of advance and a sweepback angle of a fine droplet, classified as about 0.1 to 50 μm in size, of a spray mist attached to the substrate.

Specific examples of the poor solvent with high-leveling properties include styrene, propylene glycol monomethyl ether, propylene glycol, propylene glycol monoethyl ether, propylene glycol monomethyl ether acetate, propylene glycol monobutyl ether, diethylene glycol dimethyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, cyclohexanol, 1,3-butanediol, 1,4-butanediol, 2,3-butanediol, benzyl alcohol, furfuryl alcohol, tetrahydrofurfuryl alcohol, γ-butyl lactone and the like although not limited thereto.

Of these poor solvents with high leveling properties, propylene glycol, diethylene glycol, cyclohexanol, 1,3-butandiol, 1,4-butanediol, 2,3-butanediol and γ-butyl lactone are preferred, of which propylene glycol, cyclohexanol and 2,3-butanediol are more preferred.

The content of the poor solvent with high leveling properties relative to the total solvent used in the varnish is not limited and is generally with a range of 1 to 90 wt %.

The volatile poor solvent is an organic solvent that does not dissolve a base material, is arbitrarily miscible with a good solvent and a poor solvent with high leveling properties and evaporates from a spray mist during the course of spray application.

The volatile poor solvent has an effect of imparting good spray applicability by lowering a viscosity of a charge transporting varnish prior to spray application and concentrating the varnish by evaporation from in a spray mist. The spray applicability means a characteristic property of stably, constantly regulating a size of spray mist discharged from a spray head although depending on spray conditions. Although the concentration of the varnish depends on the amount of a volatile poor solvent added and an amount of evaporation, it is a parameter of defining or varying a thickness of a uniform, flat organic thin film at a given level.

The volatile poor solvent used in the invention differs in meaning from ordinary volatile solvents. An ordinary volatile solvent is mostly defined by a vapor pressure or a relative vapor pressure under arbitrary temperature and pressure conditions. With a volatile poor solvent used in the invention, even if temperature and pressure are regulated, the solvent may, in some case, depend, in type, on a particle size, and potential energies and kinetic energies such as a distance of attachment to a substrate, an attaching speed and the like.

Specific examples of the volatile poor solvent include toluene, p-xylene, o-xylene, ethylene glycol dimethyl ether, ethylene glycol monomethyl ether, ethylene glycol monoethyl ether, ethylene glycol monoisopropyl ether, ethylene glycol methyl ether acetate, ethylene glycol ethyl ether acetate, ethylene glycol monobutyl ether, acetone, methyl ethyl ketone, methyl isopropyl ketone, diethyl ketone, methyl isobutyl ketone, methyl normal butyl ketone, cyclohexanone, ethyl acetate, isopropyl ketone acetate, normal propyl acetate, isobutyl acetate, normal butyl acetate, methanol, ethanol, isopropanol, tert-butanol, allyl alcohol, normal propanol, 2-methyl-2-butanol, isobutanol, normal butanol, 2-methyl-1-propanol, 2-methyl-1-butanol, 1-pentanol, 2-methyl-1-pentanol, 2-ethylhexanol, 1-methoxy-2-butanol, diacetone alcohol, isopropyl ether, 1,4-dioxane and the like although not limited thereto.

Of these volatile poor solvents, methyl ethyl ketone, methanol, ethanol, isopropanol, tert-butanol, normal propanol, isobutanol, normal butanol and ethylene glycol monobutyl ether are preferred, of which ethanol, isopropanol, isobutanol and ethylene glycol monobutyl ether are more preferred.

The content of the volatile poor solvent relative the total solvent used in the varnish is not limited and generally ranges 1 to 90 wt %, preferably 1 to 50 wt %.

It will be noted that such a combination of a good solvent and poor solvents as not to provide a uniform solution but make a dispersion or emulsion when mixing a poor solvent with high leveling properties and a volatile poor solvent with a good solvent is not favorable.

Preferred solvent compositions include DMI, cyclohexanol and isobutanol, DMI, cyclohexanol and ethanol, NMP, cyclohexanol and isobutanol, NMP, cyclohexanol and ethanol, DMAc, cyclohexanol and isobutanol, DMAc, cyclohexanol and ethanol, DMI, 2,3-butanediol and isobutanol, DMI, 2,3-butanediol and ethanol, NMP, 2,3-butanediol and isobutanol, NMP, 2,3-butanediol and ethanol, DMAc, 2,3-butanediol and isobutanol, DMAc, 2,3-butanediol and ethanol, DMI, dipropylene glycol and isobutanol, DMI, dipropylene glycol and ethanol, NMP, dipropylene glycol and isobutanol, NMP, dipropylene glycol and ethanol, DMAc, dipropylene glycol and isobutanol, DMAc, dipropylene glycol and ethanol, DMI, cyclohexanol and ethylene glycol monobutyl ether, and the like although not limited thereto.

Of these solvent compositions, DMI, cyclohexanol and isobutanol, DMI, cyclohexanol and ethanol, DMI, 2,3-butanediol and isobutanol, DMI, 2,3-butanediol and ethanol, NMP, cyclohexanol and isobutanol, NMP, cyclohexanol and ethanol, and DMI, cyclohexanol and ethylene glycol monobutyl ether are preferred, of which DMI, cyclohexanol and isobutanol, DMI, 2,3-butanediol and ethanol, DMI, 2,3-butanediol and isobutanol, and DMI, cyclohexanol and ethylene glycol monobutyl ether are more preferred.

The method for preparing a charge transporting varnish is not limited. In general, the respective materials are mixed to prepare the varnish.

The organic compound and oligomer used in the invention are not limited to specific ones so far as they are dissolved in solvent.

Although the charge transporting monomer and charge transporting oligomer used in the invention are not limited specifically so far as they are dissolved in solvent, it is preferred that they have a structure wherein at least one type of conjugated unit is repeated.

The conjugated unit maybe an atom, an aromatic ring or a conjugated group capable of transporting a charge and is not limited specifically. Preferred ones include a substituted or unsubstituted di- to tetra-valent, aniline group, thiophene group, furan group, pyrrole group, an ethynylene group, vinylene group, phenylene group, naphthalene group, oxadiazole group, quinoline group, silol group, silicon atom, pyridine group, phenylenevinylene group, fluorene group, carbazole group, triarylamine group, a metal or metal-free phthalocyanine group, metal or metal-free porphyrin or the like.

For the specific examples of the substituents of the conjugated unit, mention is made, independently, of hydrogen, a hydroxyl group, a halogen group, an amino group, a silanol group, a thiol group, a carboxyl group, a phosphate group, a phosphoric ester group, an ester group, a thioester group, an amido group, a nitro group, a monovalent hydrocarbon group, an organoxy group, an organoamino group, an organosilyl group, an organothio group, an acyl group, a sulfone group and the like. Any of the functional groups may be further attached to these functional groups.

Specific examples of the monovalent hydrocarbon group include: an alkyl group such as a methyl group, an ethyl group, a propyl group, a butyl group, a t-butyl group, a hexyl group, an octyl group, a decyl group or the like; a cycloalkyl group such as a cyclopentyl group, a cyclohexyl group or the like; a bicycloalkyl group such as a bicyclohexyl group or the like; an alkenyl group such as a vinyl group, a 1-propenyl group, a 2-propenyl group, an isopropenyl group, a 1-methyl-2-propenyl group, a 1, 2 or 3-butenyl group, a hexenyl group or the like; an aryl group such as a phenyl group, a xylyl group, a tolyl group, a biphenyl group, a naphthyl group or the like; an aralkyl group such as a benzyl group, a phenylethyl group, a phenylcyclohexyl group or the like; and those groups wherein a part or whole of the hydrogen atoms of these monovalent hydrocarbon group is substituted with a halogen atom, a hydroxyl group, an alkoxy group or the like.

Specific examples of the organoxy group include an alkoxy group, an alkenyloxy group, an aryloxy group and the like wherein the alkyl group, alkenyl group and aryl group are those specifically indicated above.

Specific examples of the organoamino group include: an alkylamino group such as a phenylamino group, a methylamino group, an ethylamino group, a propylamine group, a butylamino group, a pentylamino group, a hexylamino group, a heptylamino group, an octylamino group, a nonylamino group, a decylamino group, a laurylamino group or the like; a dialkylamino group such as a dimethylamino group, a diethylamino group, a dipropylamino group, a dibutylamine group, a dipentylamino group, a dihexylamino group, a diheptylamino group, a dioctylamino group, a dinonylamino group, a didecylamino group or the like; and a cyclohexylamino group, a morpholino group or the like.

Specific examples of the organosilyl group include a trimethylsilyl group, a triethylsilyl group, a tripropylsilyl group, a tributylsilyl group, a tripentylsilyl group, a trihexylsilyl group, a pentyldimethylsilyl group, a hexyldimethylsilyl group, an octyldimethylsilyl group, a decyldimethylsilyl group and the like.

Specific examples of the organothio group include alkylthio groups such as a methylthio group, an ethylthio group, a propylthio group, a butylthio group, a pentylthio group, a hexylthio group, a heptylthio group, an octylthio group, a nonylthio group, a decylthio group, a laurylthio group and the like.

Specific examples of the acyl group include a formyl group, an acetyl group, a propionyl group, a butyryl group, an isobutyryl group, a valeryl group, an isovaleryl group, a benzoyl group and the like.

The alkyl group, alkoxy group, thioalkyl group, alkylamino group, organosiloxy group, organosilyl group and the like are not limited in the number of carbon atoms and generally have 1 to 20 carbon atoms, preferably 1 to 8 carbon atoms, respectively.

Preferred substituents include fluorine, a sulfone group, and a substituted or unsubstituted organoxy group, alkyl group, organosilyl group and the like.

The conjugated chain formed by connecting conjugated units may contain a cyclic part.

The molecular weight of a charge transporting monomer ranges 200 to 1000.

The number average molecular weight of a charge transporting oligomer is generally, as a lower limit, not smaller than 200, preferably not smaller than 400 in view of the suppression of volatility of material and the development of charge transportability and is generally, as an upper limit, not larger than 5000, preferably not larger than 2000 in view of an improvement in solubility. Preferably, the charge transporting oligomer has no molecular weight distribution, and the molecular weight is generally, as a lower limit, not smaller than 200, preferably not smaller than 400 in view of the suppression of volatility of material and the development of charge transportability and is generally, as an upper limit, not larger than 5000, preferably not larger than 2000 in view of an improvement in solubility.

It will be noted that the number average molecular weight is a value measured by gel permeation chromatography (calculated as polystyrene).

Because of high solubility and high charge transportability and an appropriate ionization potential, an oligoaniline derivative represented by the general formula (1), or a quinonediimine derivative that is an oxidized product thereof is preferred as a charge transporting material. With respect to the oligoaniline derivative, it is more preferred to carry out a reduction operation using hydrazine.

[Chemical Formula 8]

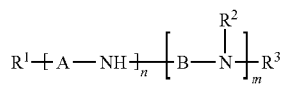

(1)

(wherein $R^1$, $R^2$ and $R^3$ independently represent hydrogen, a hydroxyl group, a halogen group, an amino group, a silanol group, a thiol group, a carboxyl group, a phosphate group, a phosphoester group, an ester group, a thioester group, an amido group, a nitro group, a monovalent hydrocarbon group, an organoxy group, an organoamino group, an organosilyl group, an organothio group, an acyl group, or a sulfone group, and A and B independently represent a divalent group of the general formula (2) or (3).

[Chemical Formula 9]

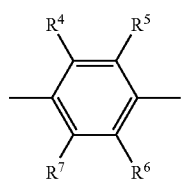

(2)

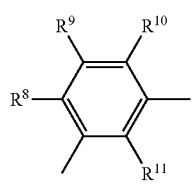

(3)

(wherein $R^4$ to $R^{11}$ independently represent hydrogen, a hydroxyl group, a halogen group, an amino group, a silanol group, a thiol group, a carboxyl group, a phosphate group, a phosphoester group, an ester group, a thioester group, an amido group, a nitro group, a monovalent hydrocarbon group, an organoxy group, an organoamino group, an organosilyl group, an organothio group, an acyl group, or a sulfone group, and m and n are independently an integer of 1 or over provided that m+n≤20 is satisfied).

It will be noted that the quinonediimine product means a compound having a partial structure represented by the following formula.

[Chemical Formula 10]

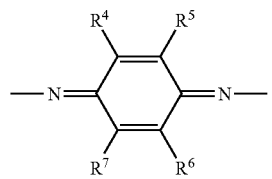

(wherein $R^4$ to $R^7$ have the same meaning as defined above).

In this connection, specific examples of $R^1$ to $R^{11}$ include similar substituent groups as set forth with respect to the substituents on the conjugated unit and these substituents may be further substituted with other optional group.

When the π conjugated system within the molecule is extended as far as possible, the resulting charge transporting thin film is improved in charge transportability. Thus, it is preferred to use an oligoaniline derivative represented by the general formula (4) or a quinonediimide derivative that is an oxidized product thereof.

[Chemical Formula 11]

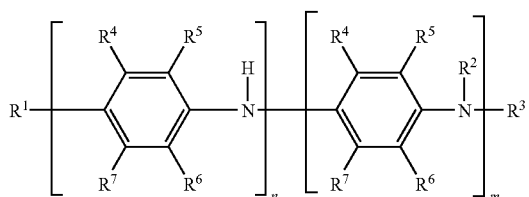

(4)

(wherein $R^1$ to $R^7$, m and n have the same meanings as defined above, respectively).

In the general formulas (1) and (4), m+n is preferably 4 or over from the standpoint of showing good charge transportability and is preferably 16 or below from the standpoint of improving solubility in solvent.

These charge transporting materials may be used singly or in combination of two or more.

Specific examples of such a compound include oligoailine derivatives soluble in organic solvents such as phenyltetraaniline, phenylpentaaniline, tetraaniline (aniline tetramer), octaaniline (aniline octomer) and like.

It is to be noted that synthesis of these charge transporting oligomers is not limited, for which mention is made of Process of Synthesizing Oligoaniline (see Bulletin of Chemical Society of Japan, 1994, Vol. 67, pp. 1749 to 1752 and Synthetic Metals, U.S.A., 1997, Vol. 84, pp. 119 to 120), and Process of Synthesizing Oligothiophene (see, for example, Heterocycles, 1987, Vol. 26, pp. 939 to 942 and Heterocycles, 1987, Vol. 26, pp. 1793 to 1796).

In addition to the embodiment using a charge transporting material, the charge transporting varnish of the invention can make use of a charge transporting organic material made of such a charge transporting material as set out above and a charge accepting dopant material. The charge transporting organic material is not critically limited so far as it is dissolved in solvent.

The charge accepting dopant materials used include an electron accepting dopant material for hole transporting material and a hole accepting dopant material for electron transporting material, both of which should preferably have high charge acceptability.

Furthermore, a charge transporting oligoaniline generally exhibits hole transportability, for which an electron accepting dopant material is preferably used as a charge transporting material.

Specific examples of the electron accepting dopant material include organic strong acids such as benzenesulfonic acid, tosylic acid, camphorsulfonic acid, hydroxybenzenesulfonic acid, 5-sulfosalyclic acid, dodecylbenzenesulfonic acid and polstyrenesulfonic acid, and oxidizing agents such as 7,7,8,8-tetracyanoquinodimethane (TCNQ) and 2,3-dichloro-5,6-dicyano-1,4-benzoquinone (DDQ) although not limited thereto.

These electron accepting dopant materials may be used singly or in combination of two or more.

In the practice of the invention, both of the charge transporting material and charge accepting dopant material are preferably in amorphous solid, and if at least one of the materials has to be used in crystalline solid, it is preferred to use a material that exhibits amorphous solidness after film formation of a charge transporting varnish.

Especially, if at least one of a charge transporting material and a charge accepting dopant material is in crystalline solid, the at least one material is preferably one having an intermolecular interaction. Where a low molecular weight compound is used as a charge accepting dopant material, a compound having three or more types of different polar functional groups in one molecule is preferred, for example.

Such a compound is not limited, for which mention is made, for example, of tiron, dihydroxybenzenesulfonic acid, and sulfonic derivatives represented by the general formula (5), of which sulfonic acid derivatives represented by the general formula (5) are preferred. Specific examples of the sulfonic derivative include a sulfosalycilic derivative such as, for example, 5-sulfosalycilic acid.

[Chemical Formula 12]

(5)

(wherein D represents a benzene ring, a naphthalene ring, an anthracene ring, a phenanthrene ring or a heterocyclic ring, and $R^{12}$ and $R^{13}$ independently represent a carboxyl group or a hydroxyl group).

The sulfonic acid derivatives represented by the general formula (6) or (7) may also be favorably used. These sulfonic acid derivatives can be synthesized based on the descriptions of PCT Patent Publication No. WO2005/000832 and PCT Patent Publication No. WO2006/025342.

[Chemical Formula 13]

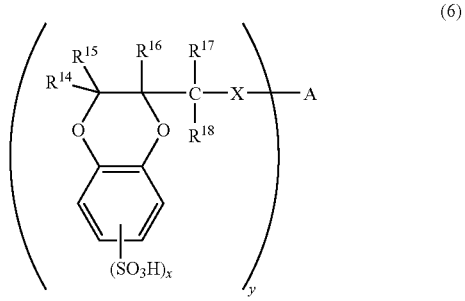

(6)

(wherein $R^{14}$ to $R^{18}$ independently represent a hydrogen atom, an unsubstituted or substituted monovalent hydrocarbon group or a halogen atom, X represents a single bond, O, S or NH, A represents a hydrogen atom, a halogen atom, O, S, an S(O) group, an $S(O_2)$ group, or N, Si, P or a P(O) group to which an unsubstituted or substituted group is bonded, or a monovalent or higher valent, unsubstituted or substituted hydrocarbon group, y is an integer that is equal to the valence of A and satisfies $1 \leq y$, and x indicates the number of sulfone groups bonded to a benzene ring moiety of 1,4-benzodioxane skeleton provided that $1 \leq x \leq 4$).

[Chemical Formula 14]

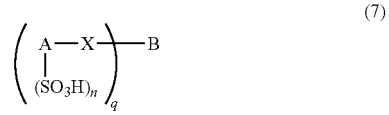

(7)

[wherein X represents O, S or NH, A represents a naphthalene ring or an anthracene ring which may have a substituent other than X and the number, n, of $(SO_3H)$ groups, and B represents an unsubstituted or substituted hydrocarbon group, a 1,3,5-triazine group or an unsubstituted or substituted group represented by the following formula (8) or (9)

[Chemical Formula 15]

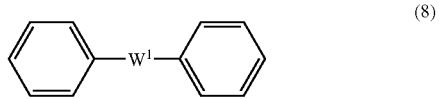

(8)

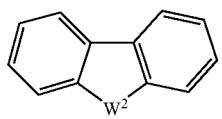

(9)

(wherein $W^1$ and $W^2$ independently represent O, S, an S(O) group, an S(O$_2$) group, or N, Si, P a P(O) group bonded with an unsubstituted or substituted group), n indicates the number of sulfone groups bonded to A and an integer satisfying 1≤n≤4, q indicates the number of bonds of B and X and an integer satisfying 1≤q].

Taking improvements in durability and charge transportability into account, B is preferably a divalent or higher valent, unsubstituted or substituted hydrocarbon group having at least one aromatic ring, a divalent or trivalent 1,3,5-triazine group, or a substituted or unsubstituted, divalent diphenylsulfone group. Especially, there are more preferably mentioned a divalent or trivalent, substituted or unsubstituted benzyl group, a divalent substituted or unsubstituted p-xylylene group, a divalent or trivalent, substituted or unsubstituted naphtyl group, a divalent or trivalent 1,3,5-triazine group, a divalent substituted or unsubstituted diphenylsulfone group, a di- to tetra-valent perfluorobiphenyl group, a divalent substituted or unsubstituted 2,2-bis(hydroxypropoxy)phenyl)propyl group, or a substituted or unsubstituted polyvinylbenzyl group.

The charge accepting dopant material is generally added at a ratio by weight of 0.01, preferably at 0.2, as a lower limit relative to one of a charge transporting material. The upper limit is not limited so far as a charge transporting material and a charge accepting dopant material are completely dissolved in a solvent and the dopant material is preferably added at a ratio by weight of 10.

The conducting thin film of the invention is formed by evaporating a solvent from a varnish applied to a substrate.

The method of evaporating a solvent is not limited and evaporation is carried out by use of a hot plate, proximity hot plate or oven in an appropriate atmosphere, i.e., in air or an inert gas such as nitrogen or the like, or in vacuum, thereby obtaining a thin film having a uniform film-formed surface.

Especially, as an evaporation method in case of being specialized to a spray process, a procedure wherein finely divided spray droplets are evaporated in the course of natural drop before they arrive at a substrate upon spray application is a very important factor when a film is selectively, flatly formed on an exposed ITO or IZO electrode portion of a substrate on which a simple or complicated pattern structure has been formed.

The baking temperature is not limited so far as it allows evaporation of solvent, and preferably ranges 40 to 250° C. In order to develop high flatness and high uniformity of a thin film or to permit the reaction to proceed on a substrate, a two-stage or more temperature change may be made when the film is formed.

For the measurement of a film thickness distribution, there can be used, for example, a high-precision fine profile measuring instrument SUREFCORDER ET4000A, made by Kosaka Laboratory Ltd. According to the measurement, structure-to-structure flatness and uniformity can be evaluated.

With respect to a method for fabricating a low molecular weight compound-based organic EL (hereinafter referred to as OLED) device making use of the charge transporting varnish (charge transporting thin film) of the invention and also to the materials used, those indicated below are mentioned although not limited thereto.

The electrode substrate used is cleaned beforehand by liquid cleaning such as with a detergent, an alcohol, pure water or the like, and it is preferred for anode substrate to conduct a surface treatment, such as ozone treatment, oxygen-plasma treatment or the like, immediately before use. In this regard, however, if an anode material is mainly composed of an organic matter, the surface treatment may not be carried out.

Where a hole transporting varnish is used in an OLED device, a thin film is formed according to the following procedure.

More particularly, a hole transporting varnish is applied onto an anode substrate by the above application process to provide a hole transporting thin film on the anode. This is introduced into a vacuum evaporation apparatus wherein a hole transporting layer, an emission layer, an electron transporting layer, an electron injection layer and a cathode metal are successively vacuum deposited to provide an OLED device. In order to control an emission region, a carrier block layer may be provided between arbitrary layers.

As an anode material, a transparent electrode typical of which is ITO or IZO can be mentioned. Those subjected to planarization treatment are preferred. Polythiophene derivatives and polyanilines having high transportability may also be used.

The materials used to form a hole transporting layer include: for example, triarylamines such as (triphenylamine) dimer derivative (TPD), (α-naphthyldiphenylamine) dimer (α-NPD), [(triphenylamine) dimer]spiro dimer (Spiro-TAD) and the like; starburst amines such as 4,4',4"-tris[3-methylphenyl(phenyl)amino]triphenylamine (m-MTDATA), 4,4',4"-tris[1-naphthyl(phenyl)amino]triphenylamine (1-TNATA); and oligothiophenes such as 5,5"-bis-{4-[bis(4-methylphenyl)amino]phenyl}-2,2':5'2"-terthiophene (BMA-3T) and the like.

The materials for forming an emission layer include, for example, tris(8-quinolilate) aluminum(III) (Alq$_3$), bis(8-quinolilate) zinc (II) (Znq$_2$), bis(2-methyl-8-qinolilate)(p-henylphenolate) aluminium (III) (BAlq) 4,4'-bis(2,2-diphenylvinyl)biphenyl (DPVBi) and the like. The material used to form the above-mentioned hole transporting layer or a material used to form the following electron transporting layer and a light-emitting dopant may be formed as an emission layer by co-deposition. In this case, the light-emitting dopants include, for example, quinacridone, rubrene, coumarin 540, 4-(dicyanomethylene)-2-methyl-6-(p-dimethylaminostyryl)-4H-pyrane (DCM), tris(2-phenylpyridine)iridium (III) (Ir(ppy)$_3$) and (1,10-phenanthroline)-tris(4,4,4-trifluoro-1-(2-thienyl) butan-1,3-dionate) europium(III) (Eu (TTA)$_3$phen) and the like.

The materials for forming an electron transporting layer include, for example, Alq$_3$, BAlq, DPVBi, (2-(4-biphenyl)-5-(4-t-butylphenyl)-1,3,4-oxadiazole)(PBD), triazole derivatives (TAZ), bathocuproine (BCP), silole derivatives and the like.

The materials used to form an electron injecting layer include, for example, lithium oxide (Li$_2$O), magnesium oxide (MgO), alumina (Al$_2$O$_3$), lithium fluoride (LiF), magnesium fluoride (MgF$_2$), strontium fluoride (SrF$_2$), Liq, Li(acac), lithium acetate, lithium benzoate and the like.

For the cathode material, mention is made, for example, of aluminium, magnesium-silver alloy, aluminium-lithium alloy, lithium, sodium, potassium, cesium and the like.

The material used to form a carrier block layer includes, for example, PBD, TAZ, BCP or the like.

Where an electron transporting varnish is used in an OLED device, a thin film may be formed according to the following procedure.

More particularly, an electron transporting varnish is applied onto a cathode substrate by such an application process as set out hereinbefore, thereby forming an electron transporting thin film on the cathode substrate. This is introduced into a vacuum deposition apparatus, followed by forming an electron transporting layer, an emission layer, a hole transporting layer and a hole injecting layer using such materials as mentioned above, respectively and forming a film of an anode material according to a sputtering method or the like to provide an OLED device.

The following method may be used for the fabrication of a polymer-based organic EL (hereinafter abbreviated as PLED) device using a charge transporting varnish of the invention although not limited thereto.

Instead of the vacuum deposition procedures for the hole transporting layer, emission layer, electron transporting layer and electron injecting layer, which are carried out for the fabrication of the OLED device, a light-emitting charge transporting polymer layer is formed, with which a PLED device including a charge transporting thin film formed from a charge transporting varnish of the invention can be fabricated.

More particularly, in the same manner as with the OLED device, a hole transporting thin film is formed on an anode substrate, on which a light-emitting charge transporting polymer layer is formed, followed by vacuum deposition of a cathode electrode to provide a PLED device.

Alternatively, an electron transporting thin film may be formed on a cathode substrate in the same manner as with the OLED device, on which a light-emitting charge transporting polymer layer is formed, followed by forming an anode electrode by sputtering, vacuum deposition, spin coating or the like method to form an anode electrode thereby providing a PLED device.

The materials for the cathode and anode include such materials as exemplified with respect to the OLED device. The cleaning treatment and surface treatment may be carried out in the same manner as illustrated with respect to the OLED device.

The light-emitting charge transporting polymer layer can be formed by dissolving or dispersing a light-emitting charge transporting polymer material or a material obtained by adding a light-emitting dopant to the polymer material in a solvent and applying the resulting dispersion or solution onto an electrode substrate on which a hole injecting layer has been formed beforehand, followed by evaporating the solvent to form a film.

The light-emitting charge transporting polymer materials include, for example, polyfluorene derivatives such as poly (9,9-dialkylfluorene) (PDAF) and the like, polyphenylenevinylene derivatives such as poly(2-methoxy-5-(2'-ethylhexoxy)-1,4-phenylenevinylene) (MEH-PPV) and the like, polythiophene derivatives such as poly(3-alkylthiophene) (PAT) and the like, polyvinylcarbazole (PVCz), and the like.

The solvents include toluene, xylene, chloroform and the like. For dissolution or uniform dispersion, there are used, for example, agitation, thermal agitation, ultrasonic dispersion and the like methods.

The application processes are not limited and include, for example, a dipping process, a spin coating process, a transfer printing process, a roll coating process, an ink jet process, a spray process, a brushing process and the like, and are preferably carried under an inert gas atmosphere such as nitrogen, argon or the like.

For evaporation of solvent, there is mentioned, for example, a method of heating with an oven or hotplate in an inert gas or in vacuum.

EXAMPLES

Examples and Comparative Examples are shown to more particularly illustrate the invention, which should not be construed as limited to the following Examples.

Reference 1

Phenyltetraaniline (hereinafter abbreviated as PTA) represented by the formula (10) was synthesized from p-hydroxydiphenylamine and p-phenylenediamine according to the procedure described in Bulletin of Chemical Society of Japan, 1994, Vol. 67, pp. 1749 to 1752 (yield: 85%).

[Chemical Formula 16]

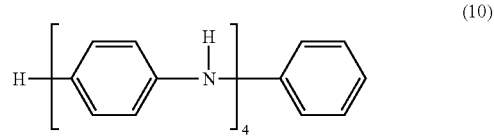

(10)

Reference 2

A structure-attached ITO substrate was made in the following way using a positive, photosensitive polyimide varnish.

According to the procedure described in Example 1 of PCT Patent Publication No. WO2003/029899, a positive, photosensitive polyimide varnish was prepared.

The resulting polyimide had a number average molecular weight of 46400 (n=70 calculated as repeating units) with a molecular weight distribution of 1.66. It will be noted that the number average molecular weight was measured by use of GPC system SSC-7200, made by Senshu Scientific Co., Ltd.

The resulting positive photosensitive polyimide varnish was dropped by spin coating over a 0.7 mm thick solid substrate of ITO having a size of 50×50 mm to form a film. The spin coater used was Spin Coater 1H-DX2, made by Mikasa Co., Ltd. After the film formation, the film was pre-baked at 80° C. for five minutes. Next, a photomask, made by Toppan Printing Co., Ltd., was used and the film was irradiated by means of a UV irradiator (PLA-501, made by Canon Inc.) for 28 seconds (150 mJ/cm$^2$). Thereafter, after development with an alkaline liquid developer (NMD-3, made by Tokyo Ohka Kogyo Co., Ltd.) for 30 seconds, pure water was used for cleaning with running water for 2 minutes. Moreover, the film was baked on a hot plate at 200° C. for 10 minute in air. The resulting pattern was a polyimide structure, which had a thickness of 700±10 nm with a line (a width of polyimide) of 30 μm and a space (between structures) of 50 μm and wherein a contact angle of water was at 85.5°. It is to be noted that all the steps of making the photosensitive polyimide structure were carried out within a clean room of class 1000.

The profile of the photosensitive polyimide structure (structure-attached ITO substrate) and the flatness of ITO at portions removed by the development were measured by use of a high-precision fine profile measuring instrument SUREFCORDER ET4000A, made by Kosaka Laboratory Ltd. The measuring conditions included a measuring range of 0.4 mm, a feed speed of 0.01 mm/second, and a contact needle pressure, serving as a measuring force, of 10 μN.

FIG. 1 shows the results of the measurement of the profile of the structure-attached ITO substrate. FIG. 2 shows the results of the measurement of the ITO portions of the structure-attached substrate. The flatness of the ITO at the portions removed by the development was found to be a maximum roughness of 10 nm.

Example 1

Under nitrogen atmosphere, 0.0637 g (0.1439 mmols) of PTA prepared in Reference 1 and 0.1256 g (0.5757 mmols) of 5-sulfosalicyclic acid (5-SSA) (made by Wako Pure Chemical Industries, Ltd.) represented by the formula (11) were completely dissolved in 1.2410 g of 1,3-dimethyl-2-imidazolidinone (DMI).

[Chemical Formula 17]

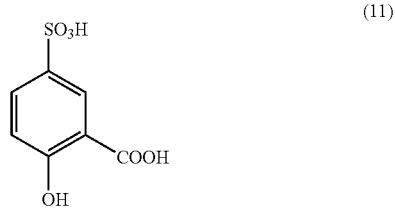

(11)

To the resulting solution, 6.2050 g of cyclohexanol (CHA) and 4.9640 g of isobutanol (IBA) were added and stirred to prepare a charge transporting varnish (solid content of 1.5%).

The resulting varnish was sprayed over the structure-attached ITO substrate, made in Reference 2, by use of a spray applicator NVD-200, made by Fujimori Technical Research Co., Ltd. The application conditions of the spray applicator included a film thickness aimed at 30 nm, X and Y scanning directions of 240 mm, X and Y offsets of 0 mm, a scan pitch of 10 mm, a gap of 150 mm, a nozzle velocity of 500 mm/sec, an amount of nitrogen of 10 L/min, a chemical amount of 1 mL/min, an application standby time of 15 seconds, and a tact time of 60 seconds. After the application, the film was baked in air on a hot plate at 180° C. for 2 hours to provide a charge transporting thin film.

FIG. 3 shows the results of measurement of a thickness distribution of the charge transporting thin film of Example 1.

Comparative Example 1

In the same manner as in Example 1, 0.0637 g (0.1439 mmols) of PTA and 0.1256 g (0.5757 mmols) of 5-SSA were completely dissolved in 1.2410 g of DMI under nitrogen atmosphere.

To the resulting solution, 9.9280 g of IBA was added and stirred to prepare a charge transporting varnish (solid content: 1.5%).

According to the procedure described in Example 1, the varnish was spray applied to provide a charge transporting thin film.

FIG. 4 shows the results of measurement of a thickness distribution of the charge transporting thin film of Comparative Example 1.

Comparative Example 2

In the same manner as in Example 1, 0.0637 g (0.1439 mmols) of PTA and 0.1256 g (0.5757 mmols) of 5-SSA were completely dissolved in 1.2410 g of DMI under nitrogen atmosphere.

To the resulting solution, 9.9280 g of CHA was added and stirred to prepare a charge transporting varnish (solid content: 1.5%).

According to the procedure described in Example 1, the varnish was spray applied to provide a charge transporting thin film.

Comparative Example 3

In the same manner as in Example 1, 0.0637 g (0.1439 mmols) of PTA and 0.1256 g (0.5757 mmols) of 5-SSA were completely dissolved in 1.2410 g, of DMI under nitrogen atmosphere to prepare a charge transporting varnish (solid content: 1.5%).

According to the procedure described in Example 1, the varnish was spray applied to provide a charge transporting thin film.

Example 2

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 1.2410 g of cyclohexanol (CHA) was added first and 9.9280 g of isobutanol (IBA) then and stirred to prepare a charge transporting varnish (solid content: 1.5%).

According to the procedure described in Example 1, the varnish was spray applied to provide a charge transporting thin film.

Example 3

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 2.4820 g of CHA was added first and 8.6870 g of IBA then and stirred to prepare a charge transporting varnish (solid content: 1.5%).

According to the procedure described in Example 1, the varnish was spray applied to provide a charge transporting thin film.

Example 4

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 3.7230 g of CHA was added first and 7.4460 g of IBA then and stirred to prepare a charge transporting varnish (solid content: 1.5%).

According to the procedure described in Example 1, the varnish was spray applied to provide a charge transporting thin film.

Example 5

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 4.9640 g of CHA was added first and 6.2050 g of IBA then and stirred to prepare a charge transporting varnish (solid content: 1.5%).

According to the procedure described in Example 1, the varnish was spray applied to provide a charge transporting thin film.

Example 6

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 7.4460 g of CHA was added first and 3.7230 g of IBA then and stirred to prepare a charge transporting varnish (solid content: 1.5%).

According to the procedure described in Example 1, the varnish was spray applied to provide a charge transporting thin film.

Example 7

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 8.6870 g of CHA was added first and 2.4820 g of IBA then and stirred to prepare a charge transporting varnish (solid content: 1.5%).

According to the procedure described in Example 1, the varnish was spray applied to provide a charge transporting thin film.

Example 8

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 9.9280 g of CHA was added first and 1.2410 g of IBA then and stirred to prepare a charge transporting varnish (solid content: 1.5%).

According to the procedure described in Example 1, the varnish was spray applied to provide a charge transporting thin film.

Example 9

In the same manner as in Example 1, 0.0637 g (0.1439 mmols) of PTA and 0.1256 g (0.5757 mmols) of 5-SSA were completely dissolved in 1.8720 g of DMI under nitrogen atmosphere. To the resulting solution, 9.3600 g of CHA was added first and 7.4880 g of IBA then and stirred to prepare a charge transporting varnish (solid content: 1.0%).

According to the procedure described in Example 1, the varnish was spray applied to provide a charge transporting thin film.

Example 10

In the same manner as in Example 1, 0.0637 g (0.1439 mmols) of PTA and 0.1256 g (0.5757 mmols) of 5-SSA were completely dissolved in 0.9255 g of DMI under nitrogen atmosphere. To the resulting solution, 4.6275 g of CHA was added first and 3.7020 g of IBA then and stirred to prepare a charge transporting varnish (solid content: 2.0%).

According to the procedure described in Example 1, the varnish was spray applied to provide a charge transporting thin film.

Example 11

In the same manner as in Example 1, 0.0637 g (0.1439 mmols) of PTA and 0.1256 g (0.5757 mmols) of 5-SSA were completely dissolved in 0.7362 g of DMI under nitrogen atmosphere. To the resulting solution, 3.6810 g of CHA was added first and 2.9448 g of IBA then and stirred to prepare a charge transporting varnish (solid content: 2.5%).

According to the procedure described in Example 1, the varnish was spray applied to provide a charge transporting thin film.

Example 12

In the same manner as in Example 1, 0.0637 g (0.1439 mmols) of PTA and 0.1256 g (0.5757 mmols) of 5-SSA were completely dissolved in 0.6100 g of DMI under nitrogen atmosphere. To the resulting solution, 3.0500 g of CHA was added first and 2.4400 g of IBA then and stirred to prepare a charge transporting varnish (solid content: 3.0%).

According to the procedure described in Example 1, the varnish was spray applied to provide a charge transporting thin film.

Example 13

In the same manner as in Example 1, 0.0637 g (0.1439 mmols) of PTA and 0.1256 g (0.5757 mmols) of 5-SSA were completely dissolved in 1.2410 g of NMP under nitrogen atmosphere. To the resulting solution, 6.2050 g of CHA was added first and 4.9640 g of IBA then and stirred to prepare a charge transporting varnish (solid content: 1.5%).

According to the procedure described in Example 1, the varnish was spray applied to provide a charge transporting thin film.

Example 14

In the same manner as in Example 1, 0.0637 g (0.1439 mmols) of PTA and 0.1256 g (0.5757 mmols) of 5-SSA were completely dissolved in 2.4820 g of DMI under nitrogen atmosphere. To the resulting solution, 3.7230 g of CHA was added first and 6.2050 g of ethanol (EtOH) then and stirred to prepare a charge transporting varnish (solid content: 1.5%).

According to the procedure described in Example 1, the varnish was spray applied to provide a charge transporting thin film.

Example 15

A varnish was prepared in the following way wherein 5-SSA used as an acceptor was changed to naphthalenedisulfonic acid oligomer (NSO-2) defined by the formula (12).

Under nitrogen atmosphere, 0.0637 g (0.1439 mmols) of PTA and 0.5601 g (0.5757 mmols) of NSO-2 represented by the formula (12) were completely dissolved in 8.1926 g of DMI. To the resulting solution, 12.2889 g of CHA was added first and 20.4814 g of ethanol (EtOH) then and stirred to prepare a charge transporting varnish (solid content: 1.5%).

According to the procedure described in Example 1, the varnish was spray applied to provide a charge transporting thin film.

[Chemical Formula 18]

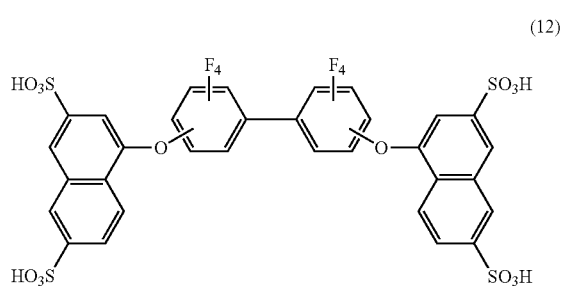

(12)

Example 6

A varnish was prepared in the following way wherein 5-SSA used as an acceptor was changed to benzodioxanesulfonic acid oligomer (BDSO-3) defined by the formula (13).

Under nitrogen atmosphere, 0.0637 g (0.1439 mmols) of PTA and 0.5647 g (0.5757 mmols) of BDSO-3 represented by the formula (13) were completely dissolved in 8.2530 g of DMI. To the resulting solution, 12.3795 g of CHA was added first and 20.6324 g of ethanol (EtOH) then and stirred to prepare a charge transporting varnish (solid content: 1.5%).

According to the procedure described in Example 1, the varnish was spray applied to provide a charge transporting thin film.

[Chemical Formula 19]

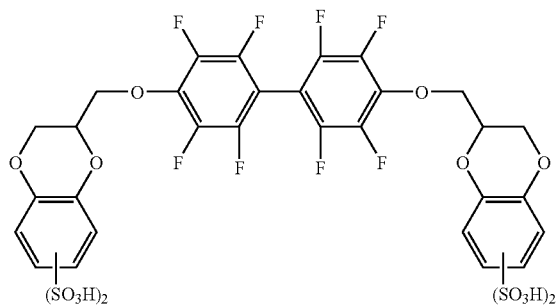

(13)

Comparative Example 4

A varnish was prepared in the following way wherein PTA serving as a host was changed to polyaniline (Pani).

Under nitrogen atmosphere, 0.0637 g of Pani and 0.1256 g (0.5757 mmols) of 5-SSA were subjected to dissolution in 2.4820 g of DMI, but complete dissolution was failed thereby providing an organic solvent dispersion. To the resulting dispersion, 3.7230 g of CHA was added first and 6.2050 g of ethanol (EtOH) then to prepare a charge transporting varnish (ideal solid content: 1.5%). It will be noted that polyaniline used was Emeraldine Base Mw ca. 50000, made by Aldrich Corp.

According to the procedure described in Example 1, the varnish was spray applied to thereby obtaining a charge transporting thin film.

Comparative Example 5

An aqueous solution of polyethylenedioxythiophene-polystyrenesulfonic acid (PEDOT:PSS) (made by Bayer AG) was spray applied according to the procedure described in Example 1 to provide a charge transporting thin film.

Example 17

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of propylene glycol was added first and 4.9640 g of IBA then and stirred to prepare a charge transporting varnish (solid content: 1.5%).

According to the procedure described in Example 1, the varnish was spray applied to provide a charge transporting thin film.

Example 18

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of 2,3-butandiol was added first and 4.9640 g of IBA then and stirred to prepare a charge transporting varnish (solid content: 1.5%).

According to the procedure described in Example 1, the varnish was spray applied to provide a charge transporting thin film.

Comparative Example 6

In the same manner as in Example 1, 0.0637 g (0.1439 mmols) of PTA and 0.1256 g (0.5757 mmols) of 5-SSA were completely dissolved in 2.0683 g of DMI under nitrogen atmosphere. To the resulting solution, 10.3417 g of propylene glycol was added and stirred to prepare a charge transporting varnish (solid content: 1.5%).

According to the procedure described in Example 1, the varnish was spray applied to provide a charge transporting thin film.

Comparative Example 7

In the same manner as in Example 1, 0.0637 g (0.1439 mmols) of PTA and 0.1256 g (0.5757 mmols) of 5-SSA were completely dissolved in 2.0683 g of DMAc under nitrogen atmosphere. To the resulting solution, 10.3417 g of 2,3-butanediol was added and stirred to prepare a charge transporting varnish (solid content: 1.5%).

According to the procedure described in Example 1, the varnish was spray applied to provide a charge transporting thin film.

Example 19

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of acetone then and stirred to prepare a charge transporting varnish (solid content: 1.5%).

According to the procedure described in Example 1, the varnish was spray applied to provide a charge transporting thin film.

Example 20

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of ethanol then and stirred to prepare a charge transporting varnish (solid content: 1.5%).

According to the procedure described in Example 1, the varnish was spray applied to provide a charge transporting thin film.

Example 21

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of methyl ethyl ketone then and stirred to prepare a charge transporting varnish (solid content: 1.5%).

According to the procedure described in Example 1, the varnish was spray applied to provide a charge transporting thin film.

Example 22

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of isopropyl alcohol then and stirred to prepare a charge transporting varnish (solid content: 1.5%).

According to the procedure described in Example 1, the varnish was spray applied to provide a charge transporting thin film.

Example 23

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of butanol then and stirred to prepare a charge transporting varnish (solid content: 1.5%).

According to the procedure described in Example 1, the varnish was spray applied to provide a charge transporting thin film.

Example 24

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of 2-methyl-1-propanol then and stirred to prepare a charge transporting varnish (solid content: 1.5%).

According to the procedure described in Example 1, the varnish was spray applied to provide a charge transporting thin film.

Example 25

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of cyclohexanone then and stirred to prepare a charge transporting varnish (solid content: 1.5%).

According to the procedure described in Example 1, the varnish was spray applied to provide a charge transporting thin film.

Example 26

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of ethylene glycol monobutyl ether (butyl cellosolve) then and stirred to prepare a charge transporting varnish (solid content: 1.5%).

The resulting varnish was spray applied onto such a structure-attached ITO substrate as made in Reference 2 by use of a spray applicator NVD-200, made by Fujimori Technical Research Co., Ltd. The application conditions of the spray applicator included a film thickness aimed at 30 nm, X and Y scanning directions of 240 mm, X and Y offsets of 0 mm, a scan pitch of 10 mm, a gap of 150 mm, a nozzle velocity of 500 mm/sec, an amount of nitrogen of 10 L/min, a chemical amount of 0.8 mL/min, an application standby time of 15 seconds, and a tact time of 60 seconds. After the application, the film was baked in air on a hot plate at 180° C. for two hours to provide a charge transporting thin film.

Comparative Example 8

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of γ-butylactone then and stirred to prepare a charge transporting varnish (solid content: 1.5%).

According to the procedure described in Example 1, the varnish was spray applied to provide a charge transporting thin film.

Comparative Example 9

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of dimethyl phthalate then and stirred to prepare a charge transporting varnish (solid content: 1.5%).

According to the procedure described in Example 26, the varnish was spray applied to provide a charge transporting thin film.

Comparative Example 10

In the same manner as in Example 1, 0.0637 g (0.1439 mmols) of PTA and 0.1256 g (0.5757 mmols) of 5-SSA were completely dissolved in 1.2410 g of DMI under nitrogen atmosphere. To the resulting solution, 6.2050 g of CHA was added first and 4.9640 g of propylene glycol then and stirred to prepare a charge transporting varnish (solid content: 1.5%).

According to the procedure described in Example 1, the varnish was spray applied to provide a charge transporting thin film.

Comparative Example 11

In the same manner as in Example 1, 0.0637 g (0.1439 mmols) of PTA and 0.1256 g (0.5757 mmols) of 5-SSA were completely dissolved in 1.2410 g of 1,3-dimethyl-2-imidazolidinone (DMI) under nitrogen atmosphere.

To the resulting solution, 6.2050 g of cyclohexanol (CHA) was added first and 4.9640 g of isobutanol (IBA) then and stirred to prepare a charge transporting varnish (solid content: 1.5%).

The resulting varnish was applied by a spin coating method aimed at a thickness of 30 nm.

After the application, a charge transporting thin film was formed by baking in air on a hot plate at 180° C. for 2 hours.

Comparative Example 12

In the same manner as in Example 1, 0.0637 g (0.1439 mmols) of PTA and 0.1256 g (0.5757 mmols) of 5-SSA were completely dissolved in 1.2410 g of 1,3-dimethyl-2-imidazolidinone (DMI) under nitrogen atmosphere.

To the resulting solution, 6.2050 g of cyclohexanol (CHA) was added first and 4.9640 g of isobutanol (IBA) then and stirred to prepare a charge transporting varnish (solid content: 1.5%).

The resulting varnish was applied by an offset printing method aimed at a thickness of 30 nm.

The printing machine used was a simple printing machine S-15, made by Nakan Corporation, wherein APR plate (400 mesh) was used for printing. The structure-attached substrate was printed at a push-in pressure of 0.25 mm after twice of blind printing and three times of applications to waste ITO substrate.

After the printing, the substrate was subjected to baking in air on a hot plate at 180° C. for 2 hours to provide a charge transporting thin film.

In Table 1, there are shown the results of measurements of the viscosity, surface tension and solid content at the times of spray application and attachment to substrate of the charge transporting varnishes prepared in Example 1 and Comparative Examples 1 to 3 and also the results of visual observation of the charge transporting thin film at the ITO solid portion thereof formed by a spray process and of thickness distribution. It will be noted that the numerical values prior to and after the arrow (→) indicated at the columns of viscosity, surface tension and solid content are, respectively, a physical value of a varnish prior to spray and a physical value of a varnish after the attachment to substrate.

The visual observation was made by use of an interference fringe inspection lamp FNA-35, made by Funatech Co., Ltd. Using the interference fringe inspection lamp, fine application unevenness could be visually, reliably observed. The standards of evaluation as ○, Δ and X are such that ○ indicates a case where a uniform film surface is obtained, Δ indicates a case where a film surface that is slightly inferior to ○ as involving an application unevenness, and X indicates a case where no uniform film surface is obtained.

The surface tension was measured by use of an automatic surface tensiometer CBVP-Z, made by Kyowa Interface Science Co., Ltd.

The solid content was measured in the following way. About 2 g of a varnish to be measured was weighed in an Al standard pan having a capacity of 23 mL, an upper diameter φ of 51 mm, a lower diameter φ of 45 mm and a depth of 12 mm and placed in a reduced pressure dryer kept at 160° C. beforehand, followed by reduction in pressure to 23 mmHg in 10 minutes and drying for 60 minutes. The dried matter was transferred from the dryer to a desiccator wherein the humidity was kept at 50 RH % and was allowed to stand for 5 minutes to weigh the resulting solid matter.

The viscosity was measured by use of an E-type viscometer, made by Toki Sangyo Co., Ltd. In spray application, the viscosity of a varnish at the time of attachment to substrate was measured in such a way that spray application was carried out under actual film formation conditions, under which a petri dish was placed on a state to collect a varnish for the measurement of the viscosity.

Examples 1 is directed to a varnish based on a mixture of three types of organic solvents composed of DMI as a good solvent, CHA as a poor solvent leveling properties, and IBA as a volatile poor solvent. This charge transporting varnish changes in liquid physical properties between the time of spray application and the time of attachment to substrate, CHA remains in the course of the spray application and IBA evaporates during the course of the spray application.

As shown in Table 1, the viscosity in Example 1 prior to the spray application was at 8.8 mPa·s and since IBA evaporated during the spray, the viscosity of the varnish arrived at the substrate increased up to 17.6 mPa·s. Thus, the varnish increased in viscosity to twice. It was found that although the surface tension slightly increased owing to the evaporation of IBA, the surface tension between the time of spray application (29.6 mN/m) and the time of attachment to the substrate (33.8 mN/m) could be controlled. It was also found that the solid matter in the varnish attached to the substrate increased from 1.5 wt % to 2.4 wt % owing to the evaporation of IBA.

The surface of the charge transporting thin film was evaluated by two evaluation methods. One is directed to thickness unevenness, and microevaluation of a film surface was made as confirmed from a thickness distribution between 50 μm thick structures. The other is directed to application unevenness, which is macro evaluation of a film surface film carried out by visually observing the surface of the charge transporting thin film.

It has been found from FIG. 3 that the charge transporting thin film of Example 1 is formed to cover ITO within a thickness distribution of 30±5 nm. This thickness distribution is preferably within a range of an intended thickness ±5 nm. If the range becomes ±10 nm or over, the thickness unevenness can be visually observed as an emission unevenness when the charge transporting thin film is assembled into an EL device and light is emitted.

Such an application unevenness (A or X in the observation of film surface as visually observed with an interference fringe inspection lamp in the observation of the film surface can be visually observed as emission unevenness when the charge transporting thin film is assembled into an EL device and light is emitted.

Comparative Example 1 relates to a varnish based on a mixture of two types of organic solvents composed of DMI as a good solvent and IBA as a volatile poor solvent, in which a poor solvent with high leveling properties is not used. This is a charge transporting varnish whose liquid physical properties changes between the time of spray application and the time at which the varnish attaches to a substrate. Since a poor solvent with high leveling properties, which is to be left in the spray mist so as to improve leveling properties, is removed, application unevenness occurs.

It has been found from FIG. 4 that the charge transporting thin film of Comparative Example 1 covers ITO in a thickness distribution of 30±11 nm and can be formed as a film in this way. It has also been found that unlike the case using the varnish of Example 1, a structure-to-structure thickness unevenness is great. This is considered for the reason that the viscosity at the time of attachment to the substrate was at 7.2 mPa·s, and thus, the viscosity is so low that structure-to-structure flow is liable to occur, resulting in the thickness unevenness.

Comparative Example 2 relates to a varnish based on a mixture of two types of organic solvents composed of DMI as a good solvent and CHA as a poor solvent with high leveling properties, in which a volatile poor solvent is not used. No change takes place in liquid physical properties between the time of spray application and the time of attachment to substrate. The viscosity at the time of spray application is so high at 25.4 mPa·s that the varnish is unlikely to be atomized by means of nitrogen, thus resulting in the unlikelihood of forming a uniform mist. This is considered for the reason why application unevenness occurs.

Comparative Example 3 relates to a varnish using a good solvent of DMI alone, in which a volatile poor solvent and a poor solvent with high leveling properties are not contained. Liquid physical properties between the time of spray application and the time of attachment to substrate do not change. The viscosity at the time of the varnish attachment is so low at 7.2 mPa·s and no poor solvent with high leveling properties for improving leveling properties is contained, for which application unevenness is considered to occur.

TABLE 1

|  | Viscosity [mPa·s] | Surface tension [mN/m] | Solid content [wt %] | Thickness distribution | Observation of film surface |
|---|---|---|---|---|---|
| Example 1 | 8.8 → 17.6 | 29.6 → 33.8 | 1.5 → 2.4 | 30 ± 5 | ○ |
| Comparative Example 1 | 3.5 → 7.2 | 27.2 → 37.0 | 1.5 → 7.0 | 30 ± 11 | Δ |
| Comparative Example 2 | 25.4 → 25.4 | 35.0 → 35.0 | 1.5 → 1.5 | — | Δ |
| Comparative Example 3 | 7.2 → 7.2 | 37.0 → 37.0 | 1.5 → 1.5 | — | X |

In Table 2, there are shown the results of measurements of the viscosity, surface tension and solid content at the times of spray application and attachment to substrate of the charge transporting varnishes prepared in Example 2 to 8 and also the results of visual observation of the charge transporting thin film at the ITO solid portion thereof formed by a spray process and of thickness distribution.

The varnishes of Examples 2 to 8, respectively, have a solid content set at 1.5 wt % and set DMI as a good solvent, CHA as a poor solvent with high leveling properties and IBA as a volatile poor solvent but with solvent composition ratios alone being changed.

It has been found that where the solid content of the varnishes of Example 2 to 8 is fixed at 1.5 wt % and a ratio of IBA is changed, the viscosity and surface tension can be varied and thus controlled.

It has also been found that the viscosity during the times of spray application and attachment to substrate can be increased from 4.8 mPa·s to 11.2 mPa·s (2.3 times greater) for Example 2, from 5.0 mPa·s to 12.5 mPa·s (2.5 times greater) for Example 3, from 5.4 mPa·s to 14.5 mPa·s (2.7 times greater) for Example 4, from 6.7 mPa·s to 16.6 mPa·s (2.5 times greater) for Example 5, from 8.8 mPa·s to 17.6 mPa·s (2.0 times greater) for Example 1, from 11.7 mPa·s to 22.5 mPa·s (1.9 times greater) for Example 6, from 15.2 mPa·s to 26.0 mPa·s (1.7 times greater) for Example 7, and from 19.5 mPa·s to 31.8 mPa·s (1.6 times greater) for Example 8, thus being increased to 1.6 to 2.7 times.

It has been found that the surface tension at the times of spray application and attachment to substrate can be controlled from 28.8 mN/m to 34.6 mN/m for Example 2, from 29.1 mN/m to 34.4 mN/m for Example 3, from 29.3 mN/m to 34.2 mN/m for Example 4, from 29.4 mN/m to 34.0 mN/m for Example 5, from 29.6 mN/m to 33.8 mN/m for Example 1, from 30.3 mN/m to 33.7 mN/m for Example 6, from 31.1 mN/m to 33.4 mN/m for Example 7, and from 32.0 mN/m to 33.3 mN/m for Example 8. Capability of controlling the surface tension is very advantageous in that optimum liquid physical properties can be selected in conformity with the surface energy of substrate.

As to the solid content at the times of spray application and attachment to substrate, it has been found that the varnishes of Examples 1 to 8 can be concentrated to 1.5 wt % to 7.0 wt %. Capability of concentrating solid content of varnishes during the times of spray application and attachment to substrate is advantageous in controlling film thickness and becomes an index in case where a parameter of spray application is selected.

It has been found that the thickness distributions of the charge transporting thin films of Examples 1 to 8 are, respectively, within 30±6 nm, and thus a thickness unevenness can be suppressed to such an extent as not to influence emission unevenness.

Further, the results of observation of film surfaces reveal that no application unevenness can be recognized with respect to all of the charge transporting thin films of Examples 1 to 8.

TABLE 2

|  | Viscosity [mPa·s] | Surface tension [mN/m] | Solid content [wt %] | Thickness distribution [nm] | Observation of film surface |
|---|---|---|---|---|---|
| Example 2 | 4.8 → 11.2 | 28.8 → 34.6 | 1.5 → 7.0 | 30 ± 6 | ○ |
| Example 3 | 5.0 → 12.5 | 29.1 → 34.4 | 1.5 → 4.8 | 30 ± 6 | ○ |
| Example 4 | 5.4 → 14.5 | 29.3 → 34.2 | 1.5 → 3.6 | 30 ± 5 | ○ |
| Example 5 | 6.7 → 16.6 | 29.4 → 34.0 | 1.5 → 2.9 | 30 ± 4 | ○ |
| Example 1 | 8.8 → 17.6 | 29.6 → 33.8 | 1.5 → 2.4 | 30 ± 5 | ○ |
| Example 6 | 11.7 → 22.5 | 30.3 → 33.7 | 1.5 → 2.1 | 30 ± 5 | ○ |
| Example 7 | 15.2 → 26.0 | 31.1 → 33.4 | 1.5 → 1.8 | 30 ± 4 | ○ |
| Example 8 | 19.5 → 31.8 | 32.0 → 33.3 | 1.5 → 1.6 | 30 ± 4 | ○ |

In Table 3, there are shown the results of measurements of the viscosity, surface tension and solid content at the times of spray application and attachment to substrate of the charge transporting varnishes prepared in Examples 1 and 9 to 12 and also the results of visual observation of the charge transporting thin films at the ITO solid portion thereof formed by a spray process and of thickness distribution.

The varnishes of Example 1 and Examples 9 to 12 set DMI as a good solvent, CHA as a poor solvent with high leveling properties and IBA as a volatile poor solvent wherein solvent composition ratios are fixed at 10:50:40, and have solid contents changed.

The solid contents of the varnishes of the Examples are, respectively, at 1.0 wt % for Example 9, 1.5 wt % for Example 1, 2.0 wt % for Example 10, 2.5 wt % for Example 11, and 3.0 wt % for Example 12.

The viscosity during the times of spray application and attachment to substrate can be increased from 8.4 mPa·s to 16.7 mPa·s (2.0 times greater) for Example 9, from 8.8 mPa·s to 17.6 mPa·s (2.0 times greater) for Example 1, from 9.2 mPa·s to 18.4 mPa·s (2.0 times greater) for Example 10, from 9.7 mPa·s to 19.3 mPa·s (2.0 times greater) for Example 11, and from 10.0 mPa·s to 20.0 mPa·s (2.0 times greater) for Example 12, thus being increased to about 2.0 times.

The surface tension at the times of spray application and attachment to substrate can be controlled from 29.4 mN/m to 33.7 mN/m for Example 9, from 29.6 mN/m to 33.8 mN/m for Example 1, from 29.6 mN/m to 33.9 mN/m for Example 10, from 29.7 mN/m to 34.1 mN/m for Example 11, and from 29.8 mN/m to 34.2 mN/m for Example 12. Capability of controlling the surface tension is very advantageous in that optimum liquid physical properties can be selected in conformity with the surface energy of substrate.

The thickness distributions of the charge transporting thin films of Examples 9 to 12 are, respectively, within 30±5 nm, and thus the thickness unevenness can be suppressed to such an extent as not to influence emission unevenness.

Further, the results of observation of film surfaces reveal that no application unevenness can be recognized with respect to all of the charge transporting thin films of Examples 9 to 12, thereby providing a uniform film surface.

The variation in solid content of the varnishes becomes an index for controlling the film thickness.

TABLE 3

| | Viscosity [mPa·s] | Surface tension [mN/m] | Solid content [wt %] | Thickness distribution [nm] | Observation of film surface |
|---|---|---|---|---|---|
| Example 9 | 8.4 → 16.7 | 29.4 → 33.7 | 1.0 → 1.6 | 30 ± 5 | ○ |
| Example 1 | 8.8 → 17.6 | 29.6 → 33.8 | 1.5 → 2.4 | 29 ± 5 | ○ |
| Example 10 | 9.2 → 18.4 | 29.6 → 33.9 | 2.0 → 3.3 | 30 ± 5 | ○ |
| Example 11 | 9.7 → 19.3 | 29.7 → 34.1 | 2.5 → 4.1 | 30 ± 5 | ○ |
| Example 12 | 10.0 → 20.0 | 29.8 → 34.2 | 3.0 → 4.9 | 31 ± 5 | ○ |

In Table 4, there are shown the results of measurements of the viscosity, surface tension and solid content at the times of spray application and attachment to substrate of the charge transporting varnishes of Examples 1 and 13, and the results of visual observation at the ITO solid portion of a charge transporting thin film formed by a spray process and of thickness distribution.

The varnishes of Examples 1 and 13 set CHA as a poor solvent with high leveling properties and IBA as a volatile poor solvent, and solvent composition ratios are so set that good solvent:CHA:IBA=10:50:40, with a solid content being fixed at 1.5 wt %, in which a good solvent is changed from one to another.

With respect to the charge transporting varnish of Example 13 using NMP as a good solvent, a charge transporting thin film of very good quality can be formed between structures.

TABLE 4

| | Viscosity [mPa·s] | Surface tension [mN/m] | Solid content [wt %] | Thickness distribution [nm] | Observation of film surface |
|---|---|---|---|---|---|
| Example 1 | 8.8 → 17.6 | 29.6 → 33.8 | 1.5 → 2.4 | 30 ± 5 | ○ |
| Example 13 | 8.2 → 15.5 | 29.5 → 33.6 | 1.5 → 2.4 | 29 ± 5 | ○ |

In Table 5, there are shown the results of measurements of the viscosity, surface tension and solid content at the times of spray application and attachment to substrate of the charge transporting varnishes of Examples 14 to 16 and Comparative Examples 4 and 5, and the results of visual observation at the ITO solid portion of a charge transporting thin film formed by a spray process and of thickness distribution.

The varnish of Example 14 is one which contains such a solute as used in Example 1 and wherein composition solvent ratios are fixed at good solvent:CHA:EtOH=20:30:50.

The varnishes of Examples 15 and 16 have composition solvent ratios fixed at good solvent:CHA:EtOH=20:30:50 with solid contents thereof being fixed at 1.5 wt %, and a dopant is changed in type.

The varnishes of Comparative Examples 4 and 5 make use of a polymer as a host. The varnish of Comparative Example 4 is a varnish of a dispersion in an organic solvent and the varnish of Comparative Example 5 is a varnish of an aqueous dispersion.

The viscosity during the times of spray application and attachment to substrate can be increased from 7.2 mPa·s to 14.2 mPa·s (2.0 times greater) for Example 14, from 4.4 mPa·s to 8.6 mPa·s (2.0 times greater) for Example 15, and from 4.1 mPa·s to 7.8 mPa·s (1.9 times greater) for Example 16.

The surface tension during the times of spray application and attachment to substrate changes from 30.1 mN/m to 35.1 mN/m for Example 14, from 29.8 mN/m to 34.9 mN/m for Example 15, and from 29.2 mN/m to 34.5 mN/m for Example 16, thereby enabling the surface tension to be controlled. Capability of controlling the surface tension is very advantageous in that optimum liquid physical properties can be selected in conformity with the surface energy of the substrate.

The solid content during the times of spray application and attachment to substrate increases from 1.5 wt % to 3.0 wt % (2.0 times greater) for Example 14, from 1.5 wt % to 3.0 wt % (2.0 times greater) for Example 15, and from 1.5 wt % to 3.0 wt % (2.0 times greater) for Example 16, thus revealing the concentration of varnish.

Further, the film thickness distributions in Examples 14 to 16 are, respectively, within 30±6 nm, revealing that the thickness unevenness is suppressed to such an extent as not to influence emission unevenness.

On the other hand, it has been found that in Comparative Examples 4 and 5, although the viscosity and surface tension during the times of spray application and attachment to substrate change, respectively, (in this regard, however, the surface tensions in Comparative Example 5 at the times of spray application and attachment to substrate are within an error range), the thickness distribution is at 15±30 nm for Comparative Example 4 and 10±30 nm for Comparative Example 5, thus revealing that the thickness unevenness is so great. Moreover, it has been confirmed that the films of Comparative Examples 4 and 5 are very great in the roughness of film surface and include, aside from application unevenness, an orange peel ascribed to foreign matters, a sea-island structure in the vicinity of the center of the substrate, and shrinkage at substrate edge portions, and the like.

TABLE 5

|  | Viscosity [mPa·s] | Surface tension [mN/m] | Solid content [wt %] | Thickness distribution [nm] | Observation of film surface |
|---|---|---|---|---|---|
| Example 14 | 7.2 → 14.2 | 30.1 → 35.1 | 1.5 → 3.0 | 30 ± 5 | ○ |
| Example 15 | 4.4 → 8.6 | 29.8 → 34.9 | 1.5 → 3.0 | 30 ± 6 | ○ |
| Example 16 | 4.1 → 7.8 | 29.2 → 34.5 | 1.5 → 3.0 | 30 ± 6 | ○ |
| Comparative Example 4 | 5.1 → 9.9 | 30.9 → 35.4 | — | 15 ± 30 | X |
| Comparative Example 5 | 3.9 → 3.8 | 75.5 → 75.5 | — | 10 ± 30 | X |

In Table 6, there are shown the results of measurements of the viscosity, surface tension and solid content at the times of spray application and attachment to substrate of the charge transporting varnishes prepared in Examples 1, 17 and 18 and Comparative Examples 2, 6 and 7 and also the results of visual observation of the charge transporting thin films at the ITO solid portion thereof formed by a spray process and of thickness distributions.

The poor solvent with high leveling properties contained in the respective varnishes is CHA for Example 1 and Comparative Example 2, propylene glycol (PG) for Example 17 and Comparative Example 6, and 2,3-butanediol (2,3-BD) for Example 18 and Comparative Example 7.

The varnishes of Comparative Examples 2, 6 and 7 are ones which are free of a volatile poor solvent.

The viscosity at the times of spray application and attachment to substrate changes from 8.8 mPa·s to 17.6 mPa·s (2.0 times greater) for Example 1, from 11.1 mPa·s to 30.6 mPa·s (2.8 times greater) for Example 17, and from 12.2 mPa·s to 44.0 mPa·s (3.6 times greater) for Example 18, enabling the viscosity to be increased to 2.0 to 3.6 times. It has been found that the viscosity can be controlled by changing the type of poor solvent with high leveling properties.

On the other hand, the viscosities of the varnishes of Comparative Examples 2, 6 and 7 at the time of attachment to substrate are same as those at the time of spray application and are, respectively, at 17.6 mPa·s, 30.6 mPa·s and 44.0 mPa·s.

The surface tension during the times of spray application and attachment to substrate changes from 29.6 mN/m to 33.8 mN/m for Example 1, from 28.1 mN/m to 33.2 mN/m for Example 17, and from 28.6 mN/m to 33.5 mN/m for Example 18, thereby enabling the surface tension to be controlled. Capability of controlling the surface tension is very advantageous in that optimum liquid physical properties can be selected in conformity with the surface energy of substrate. The surface tension at the time of attachment to substrate can be varied by changing the type of poor solvent with high leveling properties.

On the other hand, the surface tensions at the time of attachment to substrate in Comparative Example 2, 6 and 7 are same as those surface tensions at the time of spray application and are, respectively, at 33.8 mN/m, 33.2 mN/m and 33.5 mN/m.

The solid contents during the times of spray application and attachment to substrate, respectively, increase from 1.5 wt % to 2.4 wt % (1.6 times greater) for Example 1, from 1.5 wt % to 2.4 wt % (1.6 times greater) for Example 17, and from 1.5 wt % to 2.4 wt % (1.6 times greater) for Example 18, revealing that the varnishes can be concentrated.

On the other hand, the solid contents at the time of attachment to substrate in Comparative Examples 2, 6 and 7 are same as those at the time of spray application and are, respectively, at 2.4 wt %, 2.4 wt % and 2.4 wt %.

The thickness distributions of Examples 1, 17 and 18 are, respectively, at about 30-6 nm, from which it has been found that the thickness unevenness is suppressed to such an extent as not to influence emission unevenness.

Further, the results of observation of film surface demonstrate that application unevenness is not recognized in all of Examples 1, 17 and 18 to provide uniform film surfaces.

On the other hand, the thickness distributions of Comparative Examples 6 and 7 are, respectively, at 25±12 nm and 25±11 nm, thus thickness unevenness being very great.

In addition, it has been confirmed from the results of observation of film surface that application unevenness on film surface appears in Comparative Examples 2, 6 and 7.

TABLE 6

|  | Viscosity [mPa·s] | Surface tension [mN/m] | Solid content [wt %] | Thickness distribution [nm] | Observation of film surface |
|---|---|---|---|---|---|
| Example 1 | 8.8 → 17.6 | 29.6 → 33.8 | 1.5 → 2.4 | 30 ± 5 | ○ |
| Example 17 | 11.1 → 30.6 | 28.1 → 33.2 | 1.5 → 2.4 | 30 ± 5 | ○ |
| Example 18 | 12.2 → 44.0 | 28.6 → 33.5 | 1.5 → 2.4 | 30 ± 6 | ○ |
| Comparative Example 2 | 17.6 | 33.8 | 1.5 → 1.5 | — | Δ |
| Comparative Example 6 | 30.6 | 33.2 | 1.5 → 1.5 | 25 ± 12 | Δ |
| Comparative Example 7 | 44.0 | 33.5 | 1.5 → 1.5 | 25 ± 11 | Δ |

In Table 7, there are shown the results of measurements of the viscosity, surface tension and solid content at the times of spray application and attachment to substrate of the charge transporting varnishes prepared in Examples 1, 19 to 26 and Comparative Examples 8 to 10 and also the results of visual observation of the charge transporting thin films at the ITO solid portion thereof formed by a spray process and of thickness distribution.

The poor solvent with high leveling properties contained in the respective varnishes of Examples 1, 19 to 26 is isobutanol (IBA) for Example 1, acetone (ACE) for Example 19, ethanol (EtOH) for Example 20, methyl ethyl ketone (MEK) for Example 21, isopropyl alcohol (IPA) for Example 22, butanol (BuOH) for Example 23, 2-methyl-1-pentanol (2Me1PeOH) for Example 24, cyclohexanone (CHN) for Example 25, and ethylene glycol monobutyl ether (butyl cellosolve) for Example 26.

In the varnishes of Comparative Examples 8 to 10, there are used, instead of volatile poor solvent, γ-butyllactone (γ-BL) (Comparative Example 8), dimethyl phthalate (Comparative Example 9) and propylene glycol (Comparative Example 10).

In view of the solid contents at the times of spray application and attachment to substrate, it has been confirmed that the varnishes of Examples 1, 19 to 26 are concentrated, but not confirmed with respect to the varnishes of Comparative Examples 8 to 10.

The thickness distributions of Examples 1, 19 to 26 are at about 30±6 nm, revealing that the thickness unevenness is suppressed to such an extent as not to influence emission unevenness.

On the other hand, the thickness distributions of Comparative Examples 8 to 10 are, respectively, at 30±18 nm, 30±19 nm and 30±15 nm, thus revealing very great thickness unevenness.

Further, as a result of observation of film surface, no application unevenness has been confirmed in all of Examples 1, 19 to 26, with uniform film surfaces being confirmed.

On the other hand, application unevenness on film surfaces has been confirmed in Comparative Examples 8 to 10.

TABLE 7

|  | Viscosity [mPa·s] | Surface tension [mN/m] | Solid content [wt %] | Thickness distribution [nm] | Observation of film surface |
|---|---|---|---|---|---|
| Example 19 | 1.4 → 17.6 | 31.1 → 33.8 | 1.5 → 2.4 | 30 ± 5 | ○ |
| Example 20 | 3.9 → 17.6 | 31.7 → 33.8 | 1.5 → 2.4 | 31 ± 4 | ○ |
| Example 21 | 1.8 → 17.6 | 32.0 → 33.8 | 1.5 → 2.4 | 30 ± 5 | ○ |
| Example 22 | 6.0 → 17.6 | 30.0 → 33.8 | 1.5 → 2.4 | 31 ± 5 | ○ |
| Example 1 | 8.8 → 17.6 | 29.6 → 33.8 | 1.5 → 2.4 | 30 ± 5 | ○ |
| Example 23 | 7.0 → 17.6 | 31.6 → 33.8 | 1.5 → 2.4 | 30 ± 6 | ○ |
| Example 24 | 10.5 → 17.3 | 32.0 → 32.6 | 1.5 → 2.2 | 30 ± 6 | ○ |
| Example 25 | 6.0 → 7.6 | 35.3 → 35.0 | 1.5 → 1.7 | 30 ± 6 | ○ |
| Example 26 | 8.0 → 9.4 | 32.7 → 33.3 | 1.5 → 1.8 | 30 ± 5 | ○ |
| Comparative Example 8 | 5.7 → 5.7 | 34.1 → 34.1 | 1.5 → 1.5 | 32 ± 18 | X |
| Comparative Example 9 | 19.9 → 19.9 | 34.1 → 34.1 | 1.5 → 1.5 | 32 ± 19 | X |
| Comparative Example 10 | 29.8 → 29.8 | 34.1 → 34.1 | 1.5 → 1.5 | 32 ± 15 | X |

In table 8, there are shown the results of thickness distribution and observation of film surface in case where an application process is changed.

Evaluation is made such that the varnish of Example 1 is used and applied by a spray process in Example 1, a spin coating process in Comparative Example 11 and an offset printing process in Comparative Example 12.

Using the spin coating process of Comparative Example 11, the thickness distribution becomes 30±10 nm. Although good film formability is obtained, a great thickness unevenness results. It is assumed that this thickness unevenness is ascribed to the flow of varnish between structures when film formation is carried out by the spin coating process using a varnish having a viscosity of about 8.8 mPa·s.

According to the offset printing process in Comparative Example 12, the thickness distribution becomes 28±12 nm, so that thickness unevenness is great and application unevenness is observed as reflecting on film formability. It is considered that the viscosity of about 8.8 mPa·s is low for use as an optimum viscosity in the printing process and does not allow good affinity for an APR plate, thus not ensuring good transfer. Moreover, the APR plate in the printing process is in direct contact with structures, revealing that fine structures are destroyed at portions, such as an edge portion on a print side, which are liable to suffer friction.

TABLE 8

|  | Viscosity [mPa·s] | Surface tension [mN/m] | Solid content [wt %] | Thickness distribution [nm] | Observation of film surface |
|---|---|---|---|---|---|
| Example 1 | 8.8 → 17.6 | 29.6 → 33.8 | 1.5 → 2.4 | 30 ± 5 | ○ |
| Comparative Example 11 | 8.8 | 29.6 | 1.5 | 30 ± 10 | ○ |
| Comparative Example 12 | 8.8 | 29.6 | 1.5 | 28 ± 12 | Δ |

Example 27

The charge transporting thin film made in Example 1 was introduced into a vacuum deposition apparatus, followed by successive deposition of α-NPD, Alq$_3$, LiF and Al in thicknesses of 40 nm, 60 nm, 0.5 nm and 100 nm, respectively. The vacuum deposition operations were carried out after the pressure arrived at 8×10$^{-4}$ Pa or below, respectively. The deposition rates were, respectively, at 0.3 to 0.4 nm/s except for LiF and that of LiF was at 0.02 to 0.04 nm/s. A series of the deposition operations were carried out in vacuum until all the layers were deposited.

Comparative Example 13

In the same manner as in Example 27 except that the charge transporting varnish of Comparative Example 2 was used, an OLED device was fabricated to evaluate characteristics thereof.

In Table 9, there are shown characteristics and Ip of the OLED devices of Example 27 and Comparative Example 13. An emission initiation voltage or a voltage when 10 mA/cm$^2$ and 50 mA/cm$^2$ are taken as a threshold value, a luminance and a luminescent efficiency are shown as the characteristics of the OLED devices.

It will be noted that the characteristics of the OLED devices were measured by use of an organic EL luminescent efficiency measuring device (EL1003, made by Precise Gauges Co., Ltd.). Ip was measured by use of photoelectron spectrometer AC-2, made by Riken Keiki Co., Ltd.

TABLE 9

|  | Film thickness (nm) | Ip (eV) | Under passage of 10 mA/cm$^2$ | | | Under passage of 50 mA/cm$^2$ | | | Observation of light emission surface |
|---|---|---|---|---|---|---|---|---|---|
|  |  |  | Voltage (V) | Luminance (cd/m$^2$) | Luminescent efficiency (cd/A) | Voltage (V) | Luminance (cd/m$^2$) | Luminescent efficiency (cd/A) |  |
| Example 27 | 30 | 5.3 | 8.23 | 714 | 7.11 | 10.27 | 4005 | 8.00 | Uniform emission |
| Comparative Example 13 | 30 | 5.3 | 8.32 | 689 | 3.32 | 10.71 | 3155 | 4.44 | Non-uniform emission |

Comparison between the OLED device of Example 27 and the OLED device of Comparative Example 13 with respect to the OLED device characteristics in Table 9 reveals that under passage of a current of 10 mA/cm$^2$, the voltage is at 8.23 V versus 8.32 V, the luminance is at 714 cd/m$^2$ versus 689 cd/m$^2$ and the luminescent efficiency is at 7.11 cd/A versus 3.32 cd/A, and under passage of a current of 50 mA/cm$^2$, the voltage is at 10.27 V versus 10.71 V, the luminance is at 4005 cd/m$^2$ versus 3155 cd/m$^2$ and the luminescent efficiency is at 8.00 cd/A versus 4.44 cd/A. Thus, all the characteristics of the OLED device of Example 27 are superior to those of the OLED device of Comparative Example 13.

While the emission surface of the OLED device of Example 27 is such that plane emission is uniform, the OLED device of Comparative Example 13 is so contrasted that plane emission becomes bright at edge portions and dark at the central portion, thereby resulting in non-uniform emission.

It is considered that the results of Table 9 are ascribable to the thickness unevenness between structures, which is a difference between the OLED device of Example 27 having a thickness distribution of 30±5 nm and the OLED device of Comparative Example 13 having a thickness distribution of 30±10 nm. Especially, since the luminescence from the OLED device of Comparative Example 13 becomes dark at thick portions of film instead of becoming bright at thin portions, it is thus assumed that localization of luminescence occurs, thereby lowering an efficiency as plane emission. It could be readily judged that in the OLED device of Comparative Example 13 which undergoes non-uniform emission, the charge is biased, from which it will be apparent that the life becomes short and a short-circuiting characteristic lowers.

Accordingly, using the charge transporting varnish of the invention, the resulting EL device lowers in emission initiation voltage, is improved in current efficiency and has a prolonged life, thus enabling the EL device to be fabricated in good yield as being inexpensive and high in production efficiency.

The invention claimed is:

1. A charge transporting varnish for spray or ink jet application, comprising
   a charge transporting organic material made of a charge transporting monomer or a charge transporting oligomer having a number average molecular weight of 200 to 5000, or said transporting organic material and an electron accepting dopant material or a hole accepting dopant material, and
   a solvent which is a combination of
   1,3-dimethyl-2-imidazolidinone, cyclohexanol, and isobutanol,
   N-methylpyrrolidone, cyclohexanol, and isobutanol,
   N,N-dimethylacetamide, cyclohexanol, and isobutanol,
   1,3-dimethyl-2-imidazolidinone, 2,3-butanediol, and isobutanol,
   N-methylpyrrolidone, 2,3-butanediol, and isobutanol,
   N,N-dimethylacetamide, 2,3-butanediol, and isobutanol,
   1,3-dimethyl-2-imidazolidinone, dipropylene glycol, and isobutanol,
   N-methylpyrrolidone, dipropylene glycol, and isobutanol, or
   N,N-dimethylacetamide, dipropylene glycol, and isobutanol.

2. The charge transporting varnish for spray or ink jet application according to claim 1, wherein said solvent combination is
   N-methylpyrrolidone, cyclohexanol, and isobutanol,
   N-methylpyrrolidone, 2,3-butanediol, and isobutanol,
   N-methylpyrrolidone, dipropylene glycol, and isobutanol,
   1,3-dimethyl-2-imidazolidinone, cyclohexanol and isobutanol,
   1,3-dimethyl-2-imidazolidinone, 2,3-butanediol and isobutanol, or
   1,3-dimethyl-2-imidazolidinone, dipropylene glycol, and isobutanol.

3. The charge transporting varnish for spray or ink jet application according to claim 1, wherein said solvent combination is
   1,3-dimethyl-2-imidazolidinone, cyclohexanol, and isobutanol,
   N-methylpyrrolidone, cyclohexanol, and isobutanol,
   N,N-dimethylacetamide, cyclohexanol, and isobutanol,
   1,3-dimethyl-2-imidazolidinone, 2,3-butanediol, and isobutanol,
   N-methylpyrrolidone, 2,3-butanediol, and isobutanol, or
   N,N-dimethylacetamide, 2,3-butanediol, and isobutanol.

4. The charge transporting varnish for spray or ink jet application of claim 1, wherein said charge transporting material is a charge transporting monomer having a conjugated unit or a charge transporting oligomer having conjugated units and a number average molecular weight of 200 to 5000 wherein single conjugated units are sequentially bonded or two or more different types of conjugated units are sequentially combined in an arbitrary order.

5. The charge transporting varnish for spray or ink jet application according to claim 4, wherein said conjugated unit is at least one selected from substituted or unsubstituted and divalent to tetravalent, aniline, thiophene, dithiine, furan, pyrrole, ethynylene, vinylene, phenylene, naphthalene, anthracene, imidazole, oxazole, oxadiazole, quinoline, quinoquizaline, silole, silicon, pyridine, pyrimidine, pyrazine, phenylenevinylene, fluorene, carbazole, triarylamine, metal or metal-free phthalocyanine or metal or metal-free porphyrin.

6. The charge transporting varnish for spray or ink jet application according to claim 4, wherein said charge transporting material is an oligoaniline derivative represented by the general formula (1) or a quinonediimine derivative which is oxidized product of the general formula (1)

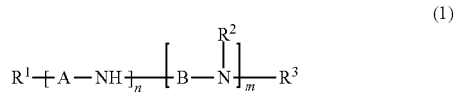

(1)

wherein R$^1$, R$^2$ and R$^3$ independently represent hydrogen, a hydroxyl group, a halogen group, an amino group, a silanol group, a thiol group, a carboxyl group, a phosphate group, a phosphoester group, an ester group, a thioester group, an amido group, a nitro group, a monovalent hydrocarbon group, an organoxy group, an organoamino group, an organosilyl group, an organothio group, an acyl group, or a sulfone group, and A and B independently represent a divalent group represented by the general formula (2) or (3)

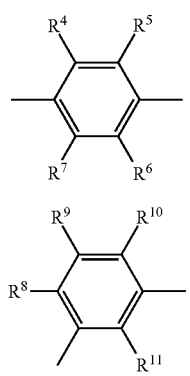
(2)

(3)

wherein $R^4$ to $R^{11}$ independently represent hydrogen, a hydroxyl group, a halogen group, an amino group, a silanol group, a thiol group, a carboxyl group, a phosphate group, a phosphoester group, an ester group, a thioester group, an amido group, a nitro group, a monovalent hydrocarbon group, an organoxy group, an organoamino group, an organosilyl group, an organothio group, an acyl group, or a sulfone group, and m and n are independently an integer of 1 or over provided that m+n 20 is satisfied.

7. The charge transporting varnish for spray or ink jet application according to claim 6, wherein said charge transporting material is an oligoaniline derivative represented by the general formula (4) or an quinonediimine derivative which is an oxidized product of the general formula (4)

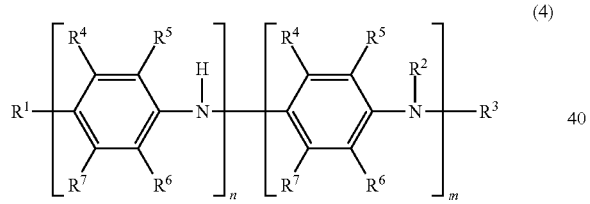
(4)

wherein $R^1$ to $R^7$, m and n, respectively, have the same meanings as defined above.

8. The charge transporting varnish for spray or ink jet application according to claim 1, wherein said electron accepting dopant material is a sulfonic acid derivative represented by the general formula (5)

(5)

wherein D represents a benzene ring, a naphthalene ring, an anthracene ring, a phenanthrene ring or a heterocyclic ring, and $R^{12}$ and $R^{13}$ independently represent a carboxyl group or a hydroxyl group.

9. The charge transporting varnish for spray or ink jet application according to claim 1, wherein said electron accepting dopant material is a sulfonic acid derivative represented by the general formula (6)

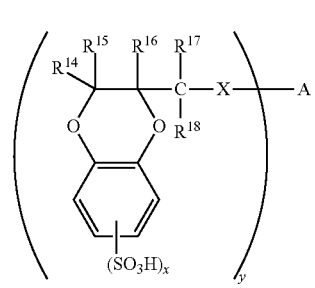
(6)

wherein $R^{14}$ to $R^{18}$ independently represent a hydrogen atom, an unsubstituted or substituted monovalent hydrocarbon group or a halogen atom, X represents a single bond, O, S or NH, A represents a hydrogen atom, a halogen atom, O, S, an S(O) group, an S(O$_2$) group, or N, Si, P or a P(O) group to which an unsubstituted or substituted group is bonded, or a monovalent or higher valent unsubstituted or substituted hydrocarbon group, y is equal to the valence of A and is such an integer as to satisfy $1 \leq y$, and x represents the number of sulfone groups bonded to a benzene ring moiety of 1,4-benzodioxane skeleton and is $1 \leq x \leq 4$.

10. The charge transporting varnish for spray or ink jet application according to claim 1, wherein said electron accepting dopant material is an arylsulfonic acid derivative represented by the general formula (7)

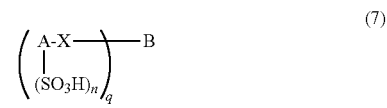
(7)

wherein X represents O, S or NH, A represents a naphthalene ring or anthracene ring which may have a substituent other than X and n, of (SO$_3$H) groups, B represents an unsubstituted or substituted hydrocarbon group, a 1,3,5-triazine group or an unsubstituted or substituted group represented by the following formula (8) or (9)

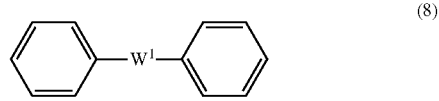
(8)

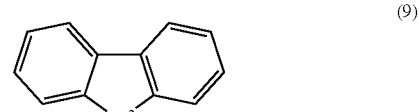
(9)

wherein $W^1$ and $W^2$ independently represent O, S, an S(O) group, an S(O$_2$) group, or N, Si, P or a P(O) group to which an unsubstituted or substituted group is bonded), n is the number of sulfone groups bonded to A and is an integer of $1 \leq n \leq 4$, and q is the number of bonds between B and X and is an integer satisfying $1 \leq q$.

11. A charge transporting thin film, characterized by being formed by use of a charge transporting varnish for spray or ink jet application defined in claim 1.

12. The charge transporting thin film according to claim 11, characterized by being formed by a spray method.

13. An organic electroluminescent device comprising a charge transporting thin film defined in claim 11.

14. The organic electroluminescent device according to claim 13, wherein said charge transporting thin film is a hole injecting layer or hole transporting layer.

15. A method for making a charge transporting thin film, characterized by applying a charge transporting varnish defined in claim 1 onto a substrate by a spray or ink jet method and evaporating a solvent.

16. The method for making a charge transporting thin film according to claim 15, wherein the application is carried out by the spray method.

* * * * *